(12) United States Patent
Tokuda

(10) Patent No.: US 11,810,925 B2
(45) Date of Patent: Nov. 7, 2023

(54) TFT ARRAY SUBSTRATE

(71) Applicant: Japan Display Inc., Tokyo (JP)

(72) Inventor: Naoki Tokuda, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/484,602

(22) Filed: Sep. 24, 2021

(65) Prior Publication Data

US 2022/0013546 A1   Jan. 13, 2022

Related U.S. Application Data

(63) Continuation of application No. 16/840,568, filed on Apr. 6, 2020, now Pat. No. 11,133,372, which is a
(Continued)

(30) Foreign Application Priority Data

Oct. 17, 2017   (JP) ................ 2017-201236

(51) Int. Cl.
*H01L 27/12*   (2006.01)
*H10K 59/122*   (2023.01)
*H10K 59/124*   (2023.01)
*H10K 59/131*   (2023.01)
*H10K 59/121*   (2023.01)
*G09G 3/3266*   (2016.01)
*H10K 59/12*   (2023.01)

(52) U.S. Cl.
CPC ....... *H01L 27/1255* (2013.01); *H10K 59/122* (2023.02); *H10K 59/124* (2023.02); *H10K 59/1213* (2023.02); *H10K 59/131* (2023.02); *G09G 3/3266* (2013.01); *G09G 2310/0202* (2013.01); *G09G 2320/0233* (2013.01); *G09G 2380/02* (2013.01); *H01L 27/124* (2013.01); *H01L 27/1248* (2013.01); *H10K 59/1201* (2023.02)

(58) Field of Classification Search
CPC ............. H01L 27/3246; H01L 27/3258; H01L 27/3262; H01L 27/3276
USPC ..................................................... 257/40
See application file for complete search history.

(56) References Cited

U.S. PATENT DOCUMENTS

2016/0111040 A1*  4/2016  Kim ............... G09G 3/2096
                                                257/773
2017/0249896 A1*  8/2017  Kim ............... H01L 27/3223
(Continued)

*Primary Examiner* — Dzung Tran
(74) *Attorney, Agent, or Firm* — Michael Best & Friedrich LLP

(57) ABSTRACT

A display device includes a plurality of pixels, first to nth scanning lines, and a first semiconductor film. The plurality of pixels is arranged in first to nth rows and first to mth columns. The first to nth scanning lines are electrically connected to the pixels in the respective first to nth rows. The first semiconductor film overlaps with at least one of first to kth scanning lines. A display region has a cutoff intersecting the first to nth rows, and the first semiconductor film is located in the cutoff. Each of the plurality of pixels includes a light-emitting element (OLED) and a transistor electrically connected to the OLED and having a second semiconductor film. The first semiconductor film and the second semiconductor film exist in the same layer. n and m are each a natural number larger than 1, and k is a natural number smaller than n.

7 Claims, 30 Drawing Sheets

Related U.S. Application Data continuation of application No. PCT/JP2018/028666, filed on Jul. 31, 2018.

(56) References Cited

U.S. PATENT DOCUMENTS

| | | | |
|---|---|---|---|
| 2018/0204889 A1* | 7/2018 | Yu | H01L 27/323 |
| 2019/0304366 A1* | 10/2019 | Ka | H01L 27/3276 |

* cited by examiner

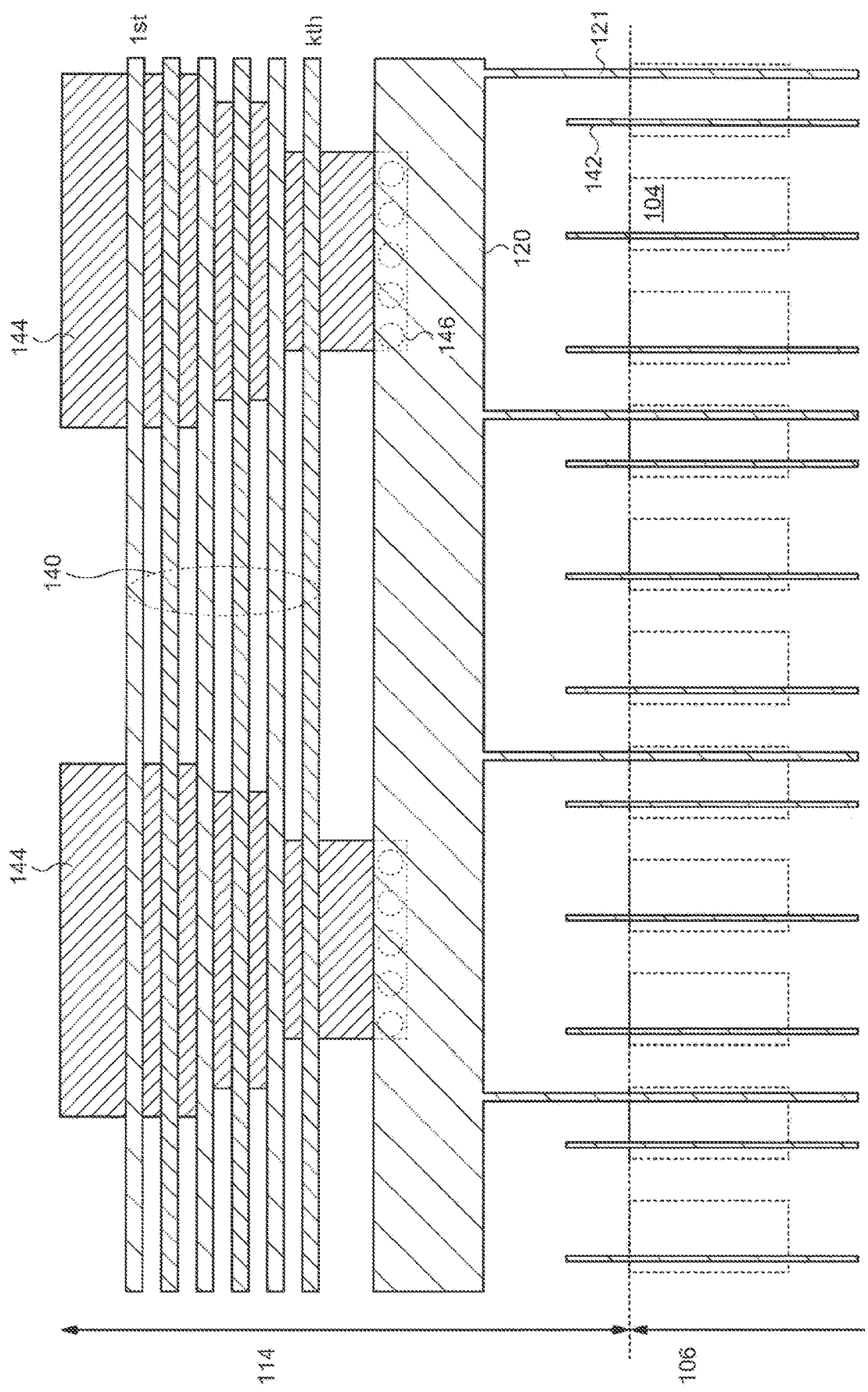

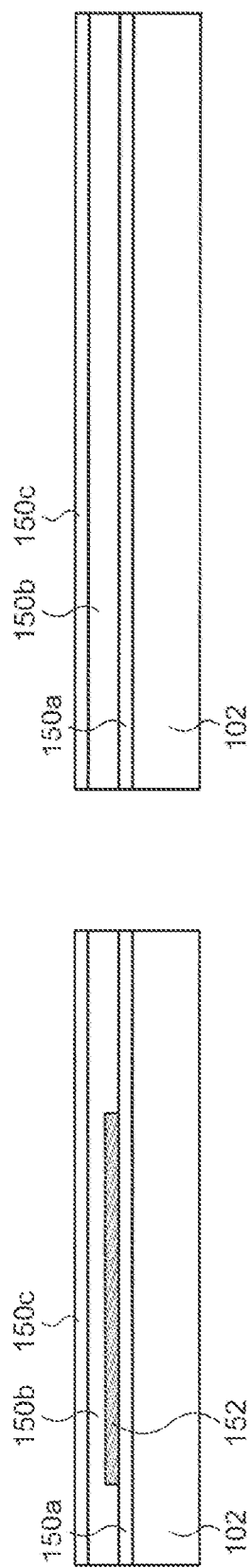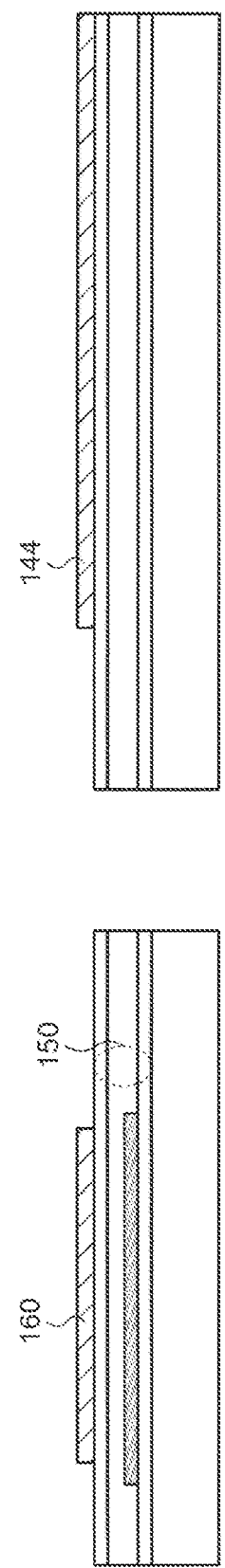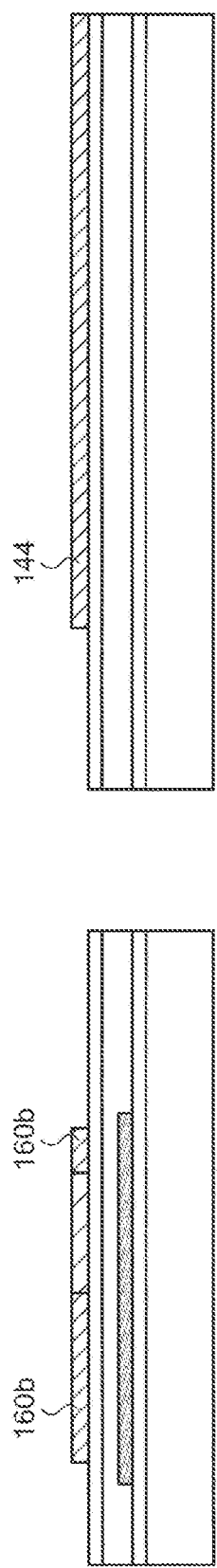

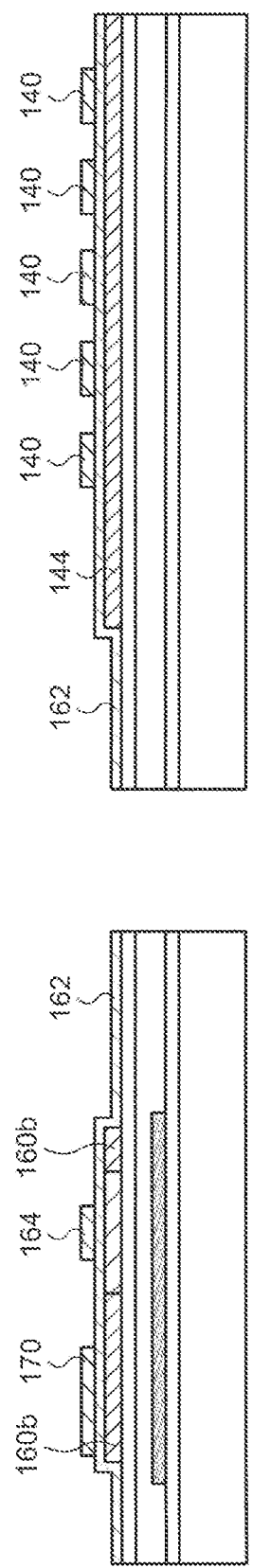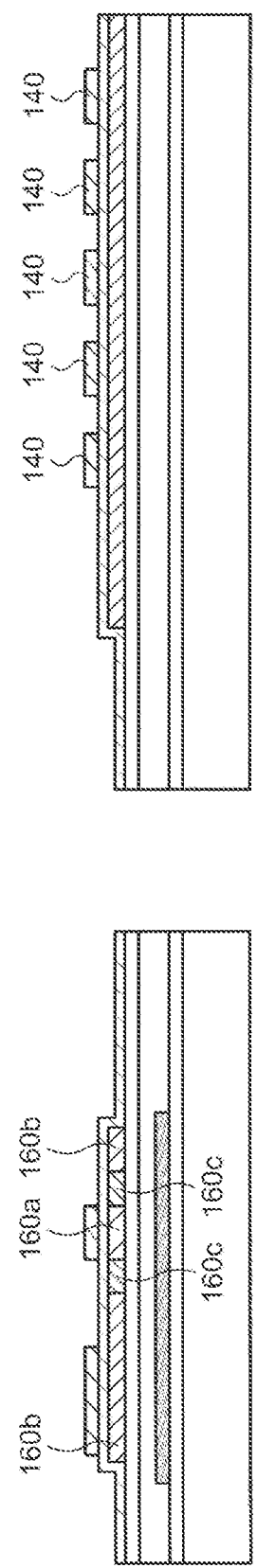

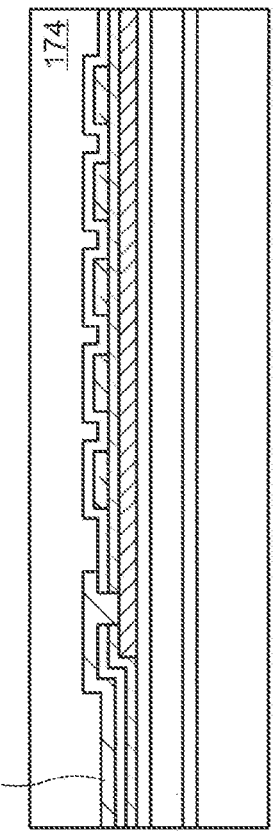
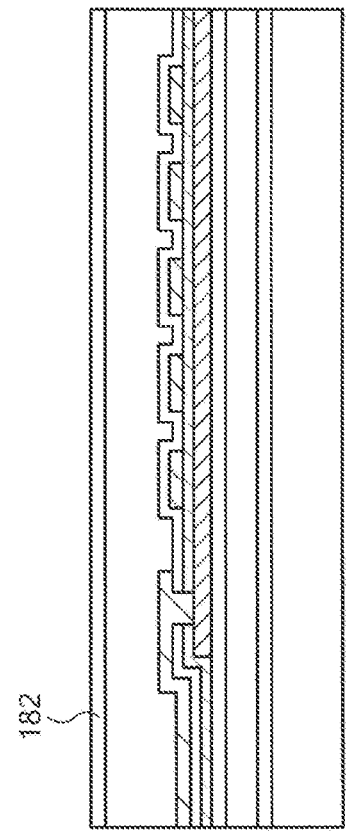
FIG. 17A
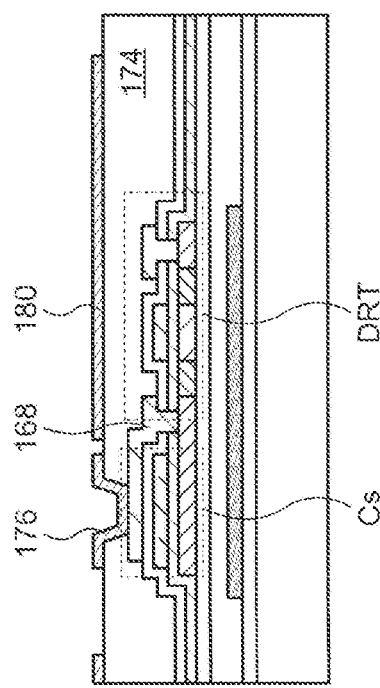
FIG. 17B
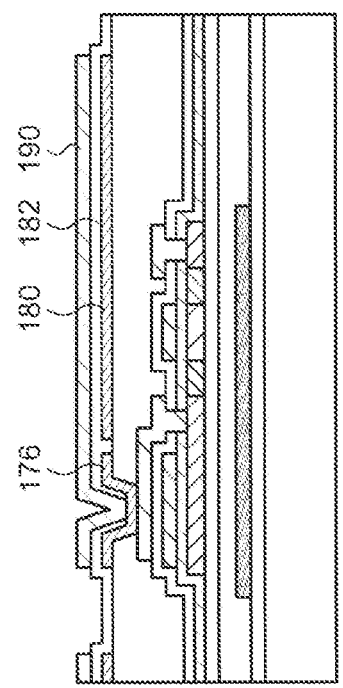

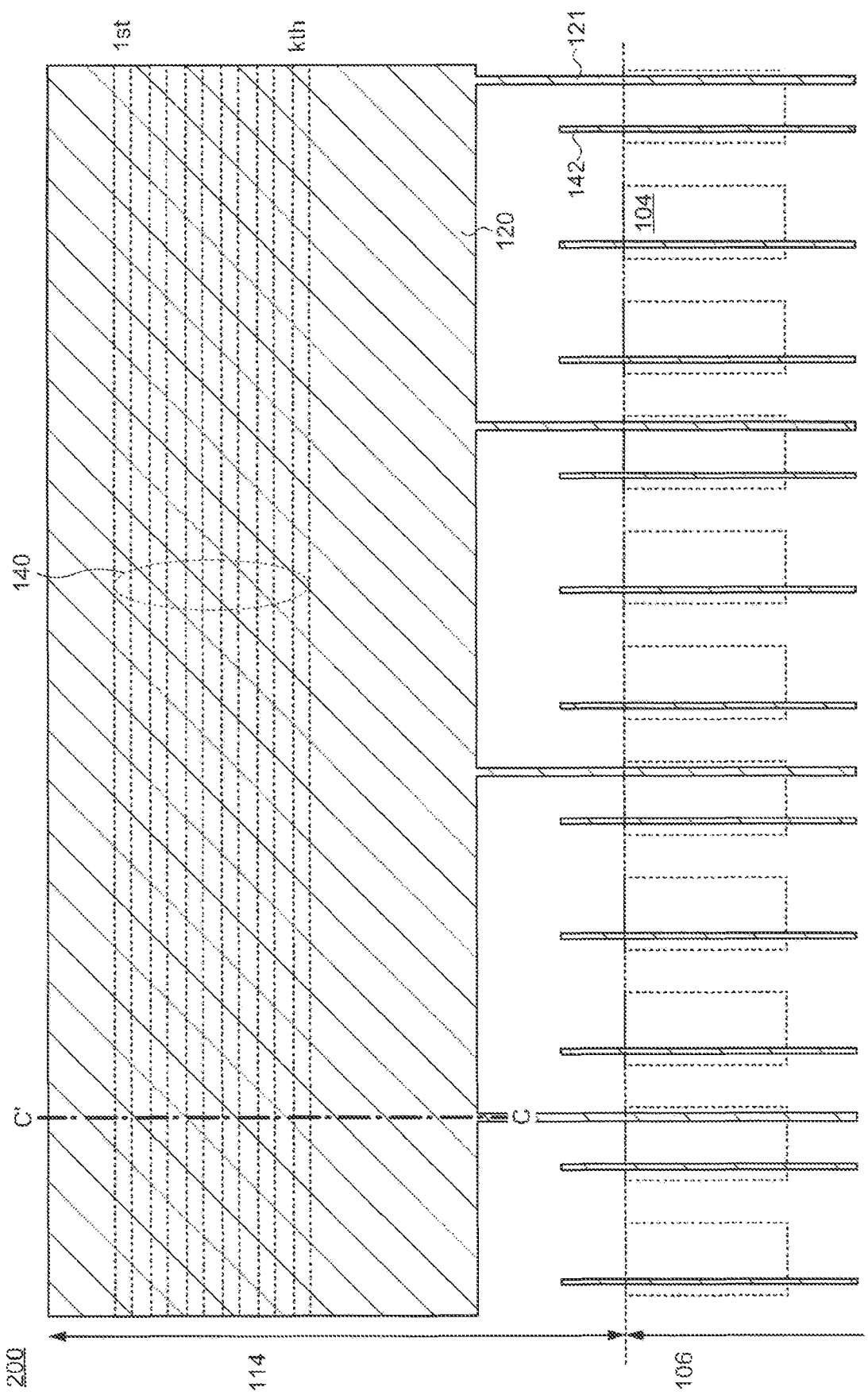

TFT ARRAY SUBSTRATE

CROSS REFERENCE TO RELATED APPLICATIONS

This application is a continuation of U.S. patent application Ser. No. 16/840,568, filed on Apr. 6, 2020. Further, this application is based on and claims the benefit of priority from the prior Japanese Patent Application No. 2017-201236, filed on Oct. 17, 2017, and the PCT Application No. PCT/JP2018/028666, filed on Jul. 31, 2018, the entire contents of which are incorporated herein by reference.

FIELD

An embodiment of the present invention relates to a display device exemplified by a display device having an organic light-emitting element as a display element.

BACKGROUND

An organic EL (Electroluminescence) display device is represented as an example of display devices. An organic EL display device has a plurality of pixels formed over a substrate, and an organic light-emitting element (hereinafter, referred to as a light-emitting element) is provided in each pixel. When a high-resolution display device or a large-size display device is produced, a pixel circuit including a plurality of transistors and capacitors and the like are formed in each pixel. The pixel circuit is driven by a driver circuit disposed over a substrate or an external circuit, thereby controlling light emission of each pixel.

Increase in size and resolution of a display device results in an increase of a load (driving load) on wirings (signal lines and scanning lines) which supply electric signals to a driver circuit due to parasitic capacitance and resistance of the wirings. A difference in amount of the load between an edge portion and a central portion of a screen causes a difference in signal delay and distortion, leading to a decrease in display quality caused by an unevenness in a displayed image. In order to prevent the unevenness in an image resulting from the signal delay and the distortion of a signal shape, Japanese Patent Application Publications 2004-125895 and H10-268348 disclose the formation of a resistance or a supplementary capacitor such as a variable capacitor at a terminal of a scanning line or a signal line.

SUMMARY

An embodiment of the present invention is a display device. The display device possesses a plurality of pixels, first to nth scanning lines, and a first semiconductor film. The plurality of pixels is arranged in first to nth rows and first to mth columns. The first to nth scanning lines are electrically connected to the pixels in the respective first to nth rows. The first semiconductor film overlaps with at least one of first to kth scanning lines selected from the first to nth scanning lines. A display region defined by the plurality of pixels has a cutoff intersecting first to nth rows, and the first semiconductor film is located in the cutoff. Each of the plurality of pixels includes a light-emitting element and a transistor electrically connected to the light-emitting element and having a second semiconductor film. The first semiconductor film and the second semiconductor film exist in the same layer. n and m are each a natural number larger than 1, and k is a natural number smaller than n.

An embodiment of the present invention is a display device. The display device possesses a plurality of pixels, first to nth scanning lines, and a metal film. The plurality of pixels is arranged in first to nth rows and first to mth columns. The first to nth scanning lines are electrically connected to the pixels in the respective first to nth rows. The metal film overlaps with at least one of first to kth scanning lines selected from the first to nth scanning lines. A display region defined by the plurality of pixels has a cutoff intersecting the first to kth rows, and the metal film is located in the cutoff. Each of the light-emitting elements includes a light-emitting element and a transistor electrically connected to the light-emitting element and having a semiconductor film and a source/drain electrode electrically connected to the semiconductor film. The metal film and the source/drain electrode exist in the same layer. n and m are a natural number larger than 1, and k is a natural number smaller than n.

An embodiment of the present invention is a display device. The display device possesses a plurality of pixels, first to nth scanning lines, and first to kth compensating transistors. The plurality of pixels is arranged in first to nth rows and first to mth columns. The first to nth scanning lines are electrically connected to the pixels in the respective first to nth rows. The first to kth compensating transistors are electrically connected to first to kth scanning lines, respectively, which are selected from the first to nth scanning lines. A display region defined by the plurality of pixels has a cutoff intersecting first to kth rows selected from the first to nth rows, and the first to kth compensating transistors are located outside the display region. Each of the plurality of pixels includes a first semiconductor film, a first gate electrode overlapping with the first semiconductor film, and a source/drain electrode electrically connected to the first semiconductor film. The first to kth compensating transistors each include a second semiconductor film, a second gate electrode overlapping with the second semiconductor film, and a first terminal and a second terminal electrically connected to the second semiconductor film. The first terminals of the first to kth transistors are respectively a part of the respective first to kth scanning lines. n and m are a natural number larger than 1, and k is a natural number smaller than n.

BRIEF DESCRIPTION OF DRAWINGS

FIG. 13 is a schematic top view of a display device according to an embodiment of the present invention;

FIG. 14A to FIG. 14C are schematic cross-sectional views showing a manufacturing method of a display device according to an embodiment of the present invention;

FIG. 15A and FIG. 15B are schematic cross-sectional views showing a manufacturing method of a display device according to an embodiment of the present invention;

FIG. 17A and FIG. 17B are schematic cross-sectional views showing a manufacturing method of a display device according to an embodiment of the present invention;

FIG. 19 is a schematic top view of a display device according to an embodiment of the present invention;

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only examples, and do not limit the interpretation of the invention. In the specification and the drawings, the same reference number is provided to an element that is the same as that which appears in preceding drawings, and a detailed explanation may be omitted as appropriate.

In the present specification and claims, when a plurality of films is formed by processing one film, the plurality of films may have functions or rules different from each other. However, the plurality of films originates from a film formed as the same layer in the same process and has the same layer structure and the same material. Therefore, the plurality of films is defined as films existing in the same layer.

In the specification and the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

First Embodiment

1. Outline Structure

Figure 1:
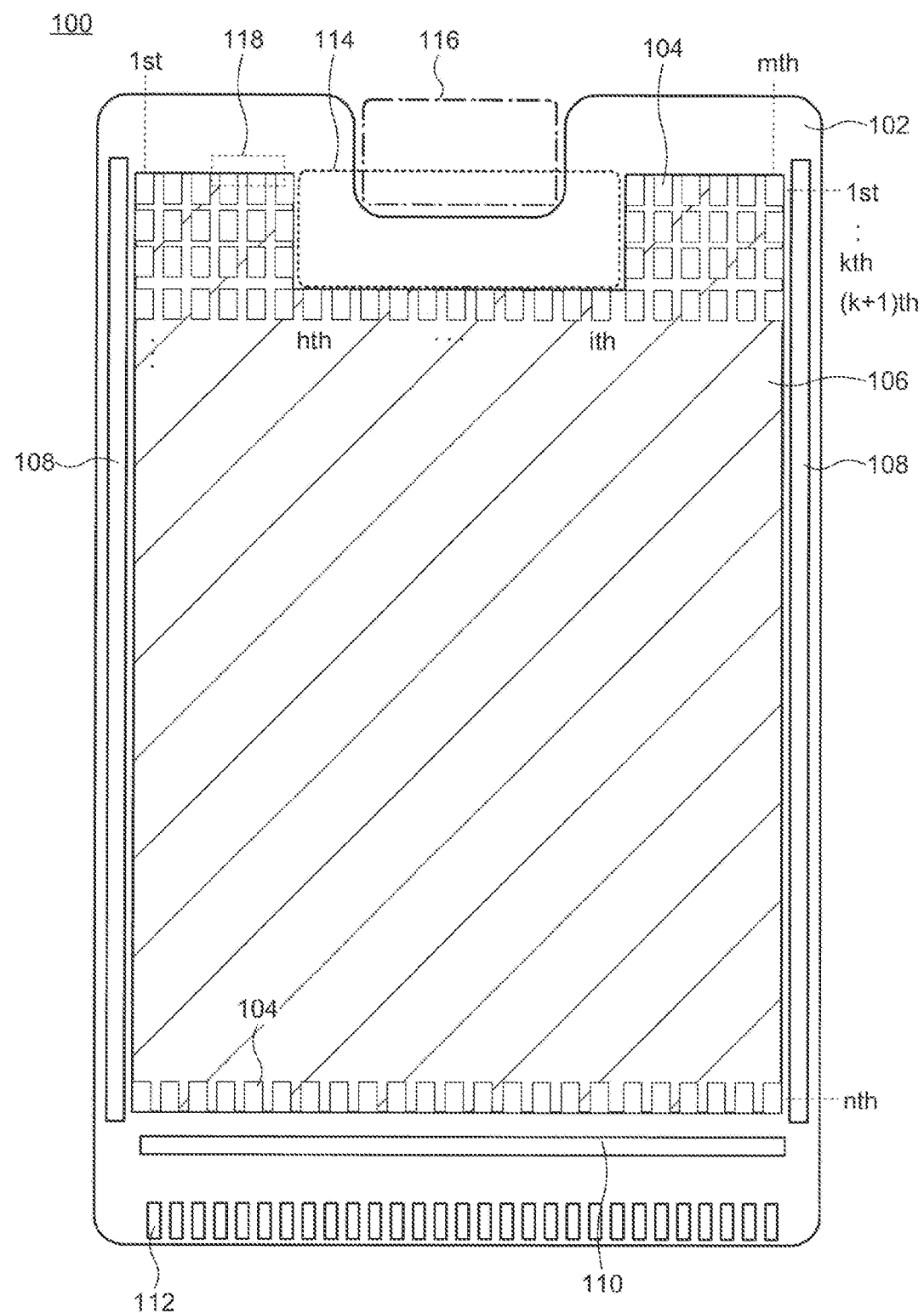
FIG. 1 is a schematic top view of a display device according to an embodiment of the present invention.

A structure of a display device 100 according to an embodiment of the present invention is explained. A schematic top view of the display device 100 is shown in FIG. 1. The display device 100 possesses a substrate 102 and has a variety of patterned insulating films, semiconductor films, and conductive films thereover. Appropriate combination of these films allows the formation of a plurality of pixels 104 and driver circuits (scanning-line driver circuits 108, signal-line driver circuit 110) for driving the pixels 104. Each pixel 104 is a minimum unit providing color information and a region including a light-emitting element OLED as well as a pixel circuit for driving light-emitting element OLED as described below. The plurality of pixels 104 is arranged in a plurality of rows (first to nth rows where n is a natural number larger than 1) and a plurality of columns (first to mth columns where m is a natural number larger than 1) and defines a display region 106. Here, in the specification and claims, the display region 106 means a single region which includes all of the pixels 104 formed over the substrate 102 and the region between the adjacent pixels 104 but does not include a cutoff 114 described below. The region over the substrate 102 surrounding the display region 106 is a frame region.

The scanning-line driver circuits 108 and the signal-line driver circuit 110 are arranged outside the display region 106 (frame region). A variety of wirings (not illustrated) extends from the display region 106, the scanning-line driver circuits 108, and the signal-line driver circuit 110 to a side of the substrate 102 and is exposed at a vicinity of an edge portion of the substrate 102 to form terminals 112. These terminals 112 are electrically connected to a connector (not illustrated) such as a flexible printed circuit substrate (FPC). A power source and image signals are supplied from an external circuit (not illustrated) through the connector, and the image signals are provided to the scanning-line side driver circuits 108 and the signal-line driver circuit 110. Signals based on these image signals are supplied to each pixel 104, by which the pixels 104 are controlled and driven to display an image on the display region 106.

As illustrated in FIG. 1, the pixels 104 are not arranged in an absolute matrix shape of n rows and m columns, and the pixels 104 are not formed in a certain region. Specifically, in the row (first row) farthest from the terminals 112 and a plurality of rows continuing from the first row (i.e., 2nd to kth rows where k is a natural number smaller than n), no pixel 104 exists in a plurality of columns. More specifically, in the first to kth rows, no pixel 104 is arranged in the hth to ith columns (h and i are each a natural number smaller than m and i is larger than h). In the case shown in FIG. 1, for example, no pixel 104 exists from the seventh (h=7) to 17th (i=17) columns in the first (k=1) to third (k=3) rows.

The region in which no pixel 104 is disposed is the cutoff 114 of the display region 106, and the first (k=1) to kth rows and the hth to ith columns intersect the cutoff 114. The cutoff 114 is formed to have an open shape reaching an edge portion of the display region 106. Since no pixel 104 is formed in the cutoff 114, no display is performed therein.

The substrate 102 may have a cutoff 116 overlapping with the cutoff 114. Similar to the cutoff 114, the cutoff 116 is formed to have an open shape reaching an edge portion of the substrate 102. Although not illustrated, an image-capturing device such as a charge-coupled device (CCD) image sensor, and a complementary metal-oxide semiconductor (CMOS) image sensor, an audio-output device, and the like may be arranged in the display device 100 so as to overlap with the cutoffs 114 and 116. Note that it is not always necessary to form the cutoff 116 in the substrate 102.

Figure 2A:
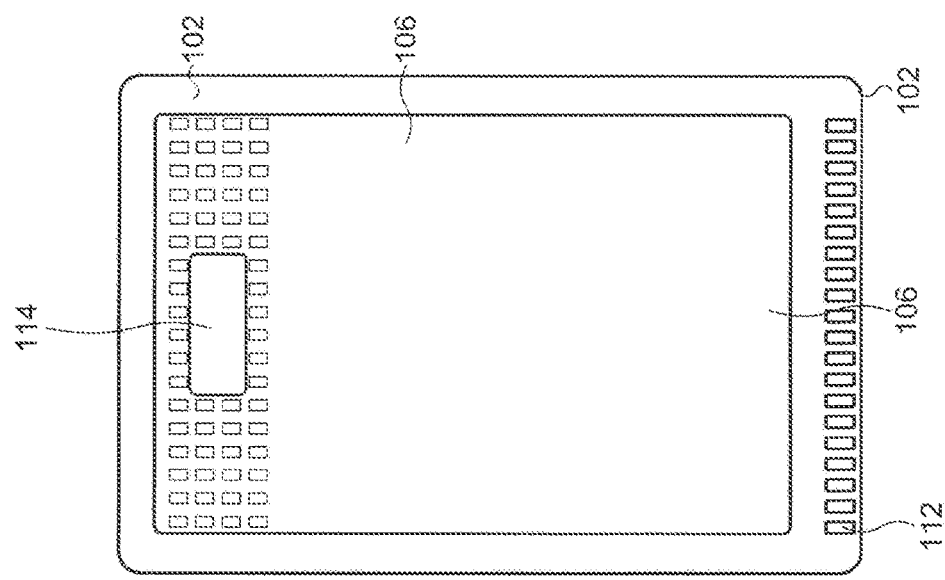
FIG. 2A to FIG. 2C are schematic top views of a display device according to an embodiment of the present invention.
Figure 2B:
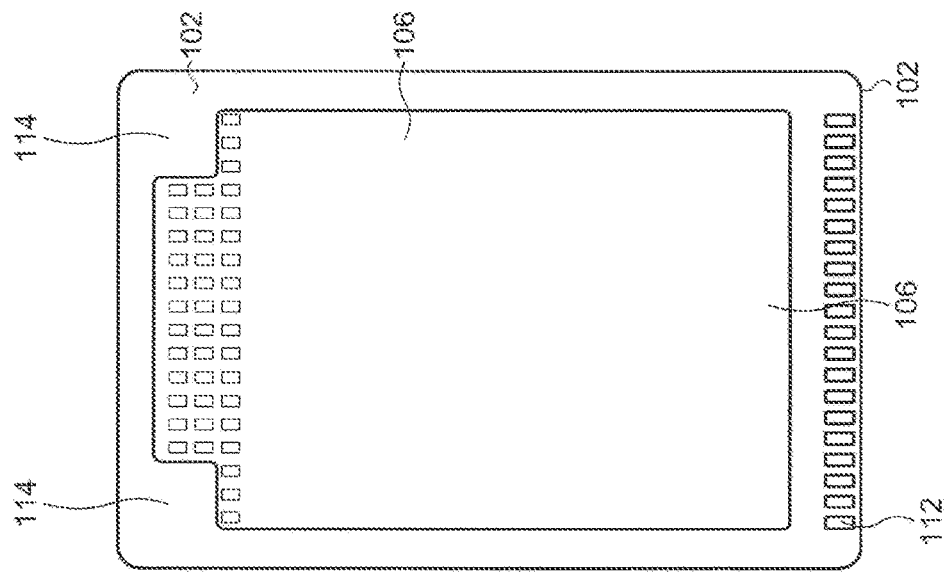
Figure 2C:
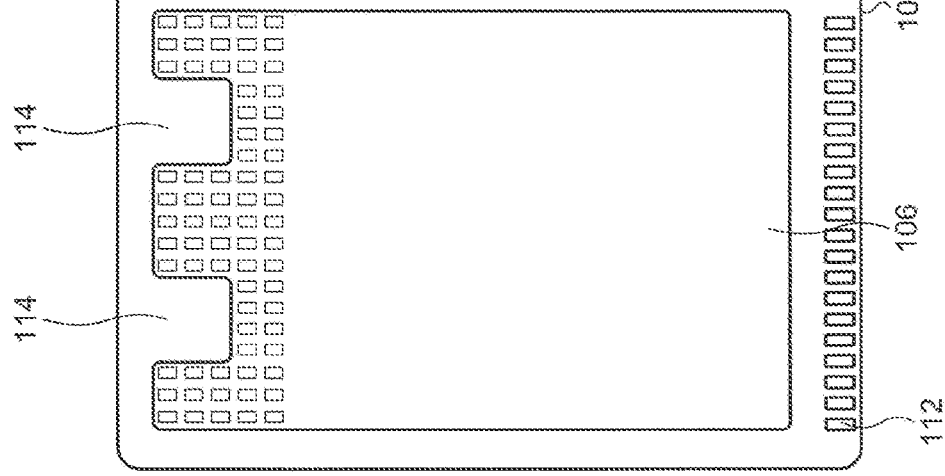

The position and the number of the cutoffs 114 are not limited to those shown in FIG. 1. For example, a plurality of cutoffs 114 may be formed in the display region 106 as shown in FIG. 2A. Alternatively, the cutoff 114 may be formed so as to reach two sides of the display region 106 perpendicularly intersecting each other as shown in FIG. 2B. Additionally, the cutoff 114 may be arranged as a close region in the display region 106 as shown in FIG. 2C. In this case, the pixels 104 are arranged so as to surround the periphery of the cutoff 114

2. Structure of Pixel 2-1. Pixel Circuit

As described above, a pixel circuit including the light-emitting element OLED is fabricated in each pixel 104 with a variety of patterned insulating films, semiconductor films, and conductive films. The structure of the pixel circuit may be arbitrarily selected, and an example is illustrated as an equivalent circuit in FIG. 3.

Figure 3:
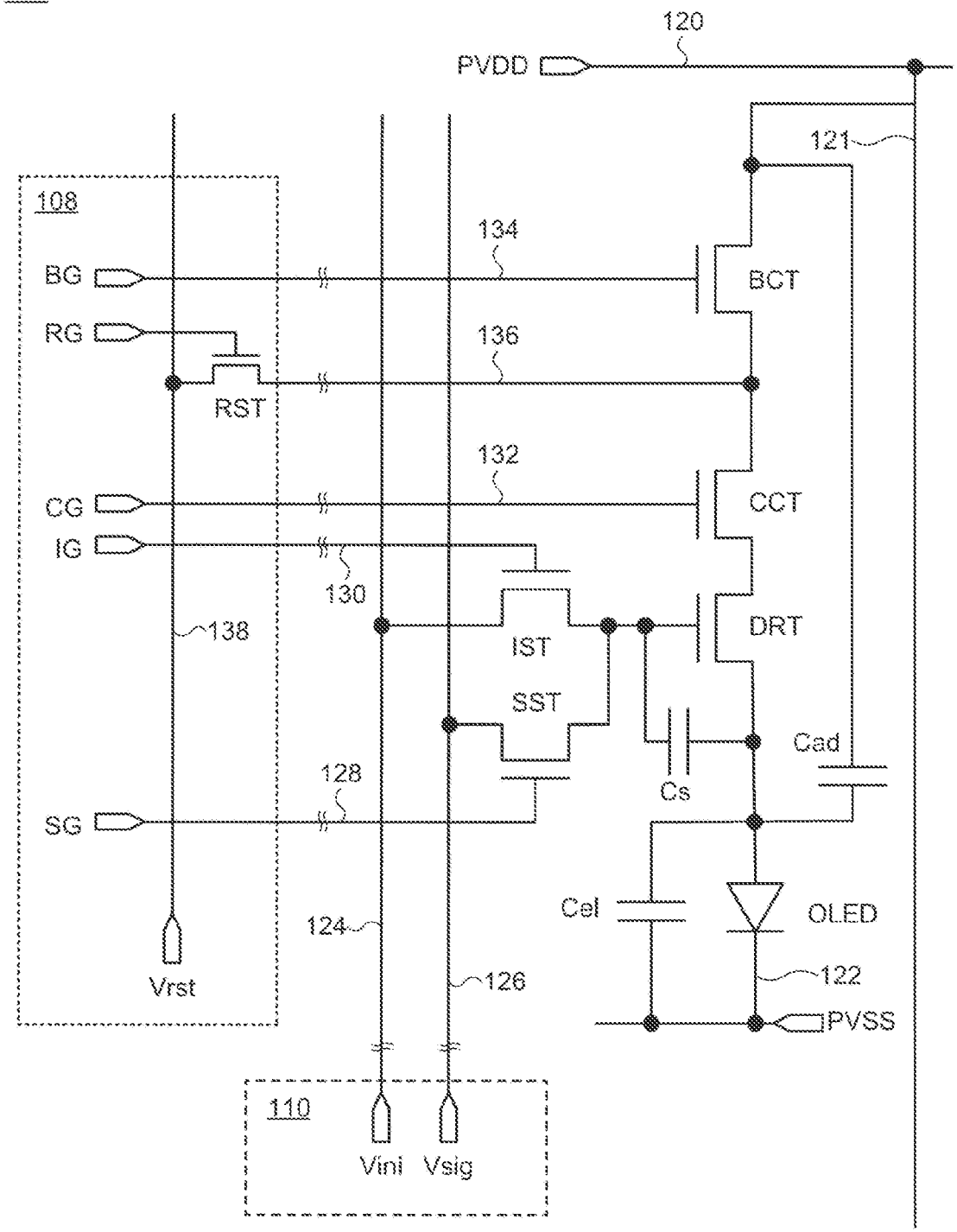
FIG. 3 is an equivalent circuit of a pixel circuit of a display device according to an embodiment of the present invention.

The pixel circuit shown in FIG. 3 possesses a driving transistor DRT, an emission-controlling transistor BCT, a compensating transistor CCT, an initialization transistor IST, a writing transistor SST, a storage capacitor Cs, and a supplementary capacitor Cad in addition to the light-emitting element OLED. A capacitor Cel is not an independent capacitor element but is a parasitic capacitance of the light-emitting element OLED. A high potential PVDD is provided to a high-potential power-source line 120, and a potential thereof is supplied to the pixels 104 connected to each column through a current-supplying line 121. The light-emitting element OLED, the driving transistor DRT, the emission-controlling transistor BCT, and the compensating transistor CCT are connected in series between the high-potential power-source line 120 and a low-potential power source line 122. The low-potential power source line 122 is provided with a low potential PVSS.

In the present embodiment, these transistors may be each fabricated as a n-channel type transistor or a p-channel type transistor. The following explanation is provided for a case where these transistors are each a n-channel type transistor, and the input-output terminals of the driving transistor DRT on the side of the high-potential power-source line 120 and on a side of the light-emitting element OLED are a drain and a source, respectively. The drain of the driving transistor DRT is electrically connected to the high-potential power-source line 120 through the emission-controlling transistor BCT and the compensating transistor CCT, while the source is electrically connected to the light-emitting element OLED A gate of the driving transistor DRT is electrically connected to a first signal line 124 through the initialization transistor IST and is also electrically connected to a second signal line 126 through the writing transistor SST. An initialization signal Vini is provided to the first signal line 124, while an image signal Vsig is provided to the second signal line 126. The initialization signal Vini is a signal giving an initialization potential at a constant level. Operation (on/off) of the writing transistor SST is controlled by a scanning signal SG supplied to a write-controlling scanning line 128 connected to a gate thereof. A gate of the initialization transistor IST is connected to an initialization-controlling scanning line 130 provided with an initialization-controlling signal IG, and operation thereof is controlled with the initialization-controlling signal IG. When the writing transistor SST is on and the initialization transistor IST is off, a potential of the image signal Vsig is provided to the gate of the driving transistor DRT. On the other hand, when the writing transistor SST is off, and the initialization transistor IST is on, a potential of the initialization signal Vini is provided to the gate of the driving transistor DRT.

A compensation-controlling scanning line 132 applied with a compensation-controlling signal CG and an emission-controlling scanning line 134 applied with an emission-controlling signal BG are respectively connected to gates of the compensating transistor CCT and the emission-controlling transistor BCT. A reset-controlling line 136 is connected to the drain of the driving transistor DRT through the compensating transistor CCT The reset-controlling line 136 is connected to a reset transistor RST disposed in the scanning-line driver circuit 108. The reset transistor RST is controlled by a reset-controlling signal RG, by which a reset potential Vrst supplied to a reset signal line 138 can be applied to the drain of the driving transistor DRT through the compensating transistor CCT.

The storage capacitor Cs is disposed between the source and gate of the driving transistor DRT. One terminal of the supplementary capacitor Cad is connected to the source of the driving transistor DRT, and the other terminal is connected to the high-potential power-source line 120. The supplementary capacitor Cad may be provided so that the other terminal is connected to the low-potential power-source line 122. The storage capacitor Cs and the supplementary capacitor Cad are formed in order to maintain a gate-source voltage Vgs corresponding to the image signal Vsig when the image signal Vsig is provided to the gate of the driving transistor DRT The signal-line driver circuit 110 respectively outputs the initialization signal Vini and the image signal Vsig to the first signal line 124 and the second signal line 126. The scanning-line driver circuit 108 respectively outputs the scanning signal SG, the initialization-controlling signal IG, the compensation-controlling signal CG, the emission-controlling signal BG, and the reset-controlling signal RG to the write-controlling scanning line 128, the initialization-controlling scanning line 130, the compensation-controlling scanning line 132, the emission-controlling scanning line 134, and a gate of the reset transistor RST.

As shown in FIG. 1, two scanning-line driver circuits 108 may be fabricated in the display device 100 so as to sandwich the display region 106. In this case, all of the signals (scanning signal SG, initialization-controlling signal IG, the compensation-controlling signal CG, and the emission-controlling signal BG) may be supplied to all of the pixels 104 arranged in one row from both the scanning-line driver circuits 108. Alternatively, a part of these signals may be supplied from one of the scanning-line driver circuits 108, and the other signals may be supplied from the other of the scanning-line driver circuits 108. With respect to the pixels 104 positioned in the row intersecting the cutoff 114, these signals may be supplied to the pixels 104 between one of the scanning-line driver circuits 108 and the cutoff 114 from one of the scanning-line driver circuits 108, while the pixels 104 between the other of the scanning-line driver circuits 108 and the cutoff may be supplied with these signals from the other of the scanning-line driver circuits 108. However, in each of the rows intersecting the cutoff 114, at least one of the signals described above is provided to all of the pixels 104 from one of the scanning-line driver circuits 108. For example, the scanning signal SG is supplied to all of the pixels 104 arranged in the row selected from the rows intersecting the cutoff 114 from one of the scanning-line driver circuits 108.

2-2. Cross-Sectional Structure

Figure 4:
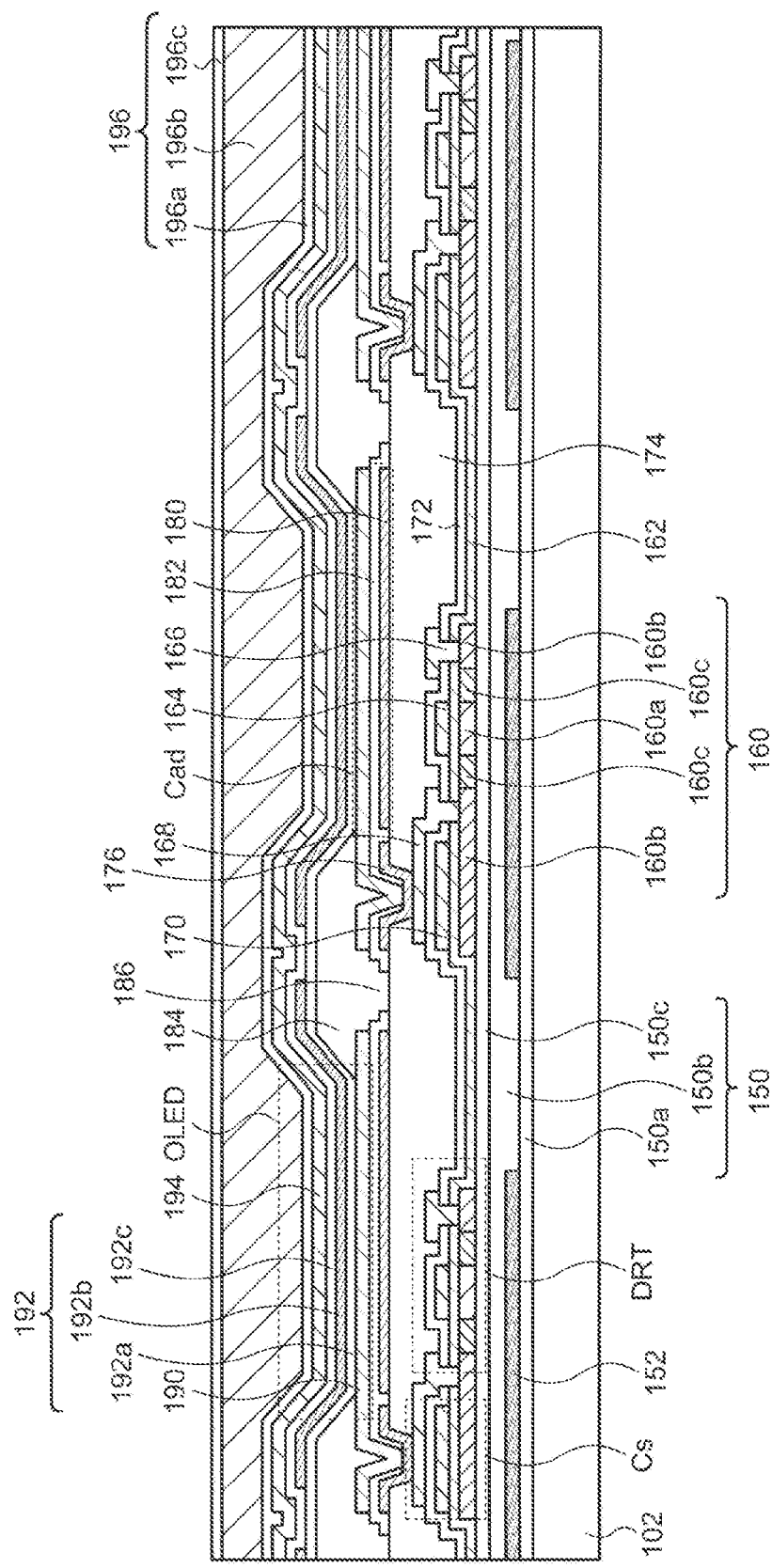
FIG. 4 is a schematic cross-sectional view of a display device according to an embodiment of the present invention.

A schematic cross-sectional view of the display device 100 is shown in FIG. 4. In FIG. 4, the cross-sectional structure of the driving transistors DRT, the storage capacitors Cs, the supplementary capacitors Cad, and the light-emitting elements OLED in adjacent three pixels 104 formed over the substrate 102 is illustrated.

Each element included in the pixel circuit is disposed over the substrate 102 through an undercoat 150. The substrate 102 may contain glass, quartz, or plastics. The use of a substrate having flexibility as the substrate 102 provides flexibility to the display device 100, allowing the production of a so-called flexible display.

The undercoat 150 may have a single-layer structure or may be structured with a plurality of films as shown in FIG. 4. In the case of using a plurality of films, the undercoat 150 may be prepared by depositing a film 150a containing silicon oxide, a film 150b containing silicon nitride, and a film 150c containing silicon oxide in this order over the substrate 102. The downmost film 150a containing silicon oxide is provided to improve adhesion with the substrate 102. The middle layer 150b containing silicon nitride is provided as a blocking film preventing entrance of impurities such as water from the outside. The upmost film 150c containing silicon oxide is provided as a blocking film preventing diffusion of the hydrogen atoms included in the film 150b containing silicon nitride toward the side of a semiconductor film 160 (described below).

As on optional structure, a light-shielding film 152 may be arranged so as to overlap with the transistor such as the driving transistor DRT formed later. The light-shielding film 152 is capable of suppressing variation of the transistor properties with light or functioning as a back gate of the transistor by being prepared with a conductive material. Here, an example is demonstrated in which the light-shielding film 152 is fabricated in an island form to cover a part of the film 150a containing silicon oxide in the region where the driving transistor DRT is to be formed, and the film 150b containing silicon nitride and the film 150c containing silicon nitride are stacked thereover. However, the light-shielding film 152 may be disposed so as to be in contact with the substrate 102, and the undercoat 150 having the three-layer structure may be arranged thereover.

The driving transistor DRT includes the semiconductor film 160, a gate insulating film 162, a gate electrode 164, and source/drain electrodes 166 and 168. The gate electrode 164 is arranged so as to intersect at least a part of the semiconductor film 160 through the gate insulating film 162, and a channel region 160a is formed in the region where the gate electrode 164 overlaps with the semiconductor film 160. The semiconductor film 160 further possesses low-concentration impurity regions 160c sandwiching the channel region 160a and doped with an impurity as well as source/drain regions 160b sandwiching these regions and doped with an impurity. An impurity concentration in the low-concentration impurity regions 160c is lower than that of the source/drain regions 160b.

A capacitor electrode 170 existing in the same layer as the gate electrode 164 is disposed so as to overlap with one of the source/drain regions 160b through the gate insulating film 162. An interlayer insulating film 172 is provided over the gate electrode 164 and the capacitor electrode 170. Openings reaching the semiconductor film 160 are formed in the interlayer insulating film 172 and the gate insulating film 162, and the source/drain electrodes 166 and 168 are arranged so as to cover the openings. A part of the source/drain electrode 168 overlaps with a part of the source/drain region 160b and the capacitor electrode 170 through the interlayer insulating film 172, and the storage capacitor Cs is formed by the part of the source/drain region 160b, a part of the gate insulating film 162, the capacitor electrode 170, the interlayer insulating film 172, and the part of the source/drain electrode 168.

A leveling film 174 is further provided over the driving transistor DRT and the storage capacitor Cs. The leveling film 174 has an opening reaching the source/drain electrode 168, and a connection electrode 176 covering this opening and a part of a top surface of the leveling film 174 is formed so as to be in contact with the source/drain electrode 168. A supplementary capacitor electrode 180 is further disposed over the leveling film 174. The connection electrode 176 and the supplementary capacitor electrode 180 may be formed simultaneously, which allows these elements to exist in the same layer. A supplementary capacitor insulating film 182 is prepared so as to cover the connection electrode 176 and the supplementary capacitor electrode 180. The supplementary capacitor insulating film 182 does not cover a part of the connection electrode 176 in the opening of the leveling film 174 and exposes a top surface of the connection electrode 176, by which the electrical connection between a pixel electrode 190 formed thereover and the source/drain electrode 168 is realized through the connection electrode 176. An opening 186 may be formed in the supplementary capacitor insulating film 182 in order to allow contact between the leveling film 174 and a partition wall 184 formed thereover. Note that the formation of the connection electrode 176 and the opening 186 is optional. The formation of the connection electrode 176 prevents corrosion of a surface of the source/drain electrode 168 in the following process, thereby preventing an increase in contact resistance of the source/drain electrode 168. Impurities in the leveling film 174 can be removed through the opening 186, by which reliability of the pixel circuit and the light-emitting element OLED can be improved.

The pixel electrode 190 is fabricated over the supplementary capacitor insulating film 182 so as to cover the connection electrode 176 and the supplementary capacitor electrode 180. The supplementary capacitor insulating film 182 is sandwiched by the supplementary capacitor electrode 180 and the pixel electrode 190, and the supplementary capacitor Cad is formed with this structure. The pixel electrode 190 is shared by the supplementary capacitor Cad and the light-emitting element OLED.

The partition wall 184 is fabricated over the pixel electrode 190 to cover an edge portion of the pixel electrode 190. Depressions and projections caused by the pixel electrode 190 are reduced by the partition wall 184, which prevents disconnection of an electroluminescence layer (hereinafter, referred to as an EL layer) 192 and an opposing electrode 194 formed thereover. The EL layer 192 and the opposing electrode 194 covering the EL layer 192 are arranged so as to cover the partition wall 184 and the pixel electrode 190. The pixel electrode 190 is an electrode provided to inject holes to the EL layer 192 and is preferred to have a relatively large work function at a surface thereof. When light emission from the light-emitting element OLED is extracted through the pixel electrode 190, the pixel electrode 190 is configured to transmit visible light. In this case, a conductive oxide capable of transmitting visible light, such as indium-tin oxide (ITO) and indium-zinc oxide (IZO), is used as a specific material. On the other hand, when the light emission from the light-emitting element OLED is extracted through the opposing electrode 194, the pixel electrode 190 is configured so as to reflect visible light. In this case, the pixel electrode 190 includes a metal with a high reflectance with respect to visible light, such as silver or aluminum. Alternatively, the pixel electrode 190 may have a stacked-layer structure of a film including a conductive oxide and a film including a metal with a high reflectance. For example, a stacked-layer structure of a first conductive film including a conductive oxide, a second conductive film including a metal such as silver or aluminum, and a third conductive layer including a conductive oxide may be employed.

The structure of the EL layer 192 is arbitrarily determined, and the EL layer 192 can be prepared by appropriately combining functional layers such as a hole-injection layer, a hole-transporting layer, an emission layer, an electron-transporting layer, an electron-injection layer, an electron-blocking layer, a hole-blocking layer, and an exciton-blocking layer. The structure of the EL layer 192 may be the same in all the pixels 104, or a part of the structure may be different between the adjacent pixels 104. For example, the pixels 104 may be configured so that the structure or the material of the emission layer is different, but the other structures are the same between the adjacent pixels 104. In FIG. 4, a hole-transporting layer 192a, an emission layer 192b, and an electron-transporting layer 192c are shown as typical functional layers for visibility.

When the light emission from the light-emitting element OLED is extracted through the pixel electrode 190, the opposing electrode 194 is configured to reflect visible light. Specifically, the opposing electrode 194 is prepared by using a metal with a high reflectance, such as aluminum, silver, and magnesium, or an alloy thereof (e.g., an alloy of magnesium and silver). On the other hand, when the light-emission from the light-emitting element OLED is extracted through the opposing electrode 194, the opposing electrode 194 is configured to include a conductive oxide capable of transmitting visible light. Alternatively, the metal or alloy described above may be deposited at a thickness which allows visible light to pass therethrough. In this case, a film of a conductive oxide exhibiting a light-transmitting property with respect to visible light may be further formed.

As an optional structure, a passivation film 196 is arranged over the opposing electrode 194. The structure of the passivation film 196 may be also arbitrarily determined, and a single-layer structure or a stacked-layer structure may be employed. In the case of a stacked-layer structure, a structure may be utilized where a first layer 196a including a silicon-containing inorganic compound, a second layer 196b including a resin, and a third layer 196c including a silicon-containing inorganic compound are successively stacked. As a silicon-containing inorganic compound, silicon nitride and silicon oxide are represented. As a resin, an epoxy resin, an acrylic resin, a polyester, a polycarbonate, and the like are exemplified.

3. Control of Driving Load

As described above, the display region 106 is provided with the cutoff 114 having an open shape, and the cutoff 114 intersects the first (k=1) to kth rows each of which is provided with the plurality of pixels 104. Furthermore, a variety of scanning lines (the write-controlling scanning line 128, the initialization-controlling scanning line 130, the compensation-controlling scanning line 132, the emission-controlling scanning line 134, the reset-controlling line 136, and the like) is electrically connected to the pixels 104 and is disposed in each of the rows. In the following explanation, these scanning lines are collectively referred to as scanning lines 140, and only one scanning line 140 is shown in each row for visibility. Therefore, the scanning lines 140 are a part of or all of the variety of scanning lines, and the scanning line 140 may be structured by only the write-controlling scanning line 128, for example.

Hence, the (k+1)th to nth scanning lines 140 connected to the plurality of pixels 104 located in the (k+1)th to nth rows can be substantially linearly arranged, while all of or a part of the first to kth scanning lines 140 connected to the pixels 104 located in the first (k=1) to kth rows are bent in order to detour around the cutoff 114. In addition, the first to kth scanning lines 140 are not connected to the pixels 104 in the plurality of columns (hth to ith columns), and a part of them passes through the cutoff 144, i.e., the frame region. Therefore, the first to kth scanning lines 140 extend between a side of the cutoff 114 parallel to the row direction and the (k+1)th row in the hth to ith columns.

Figure 5:
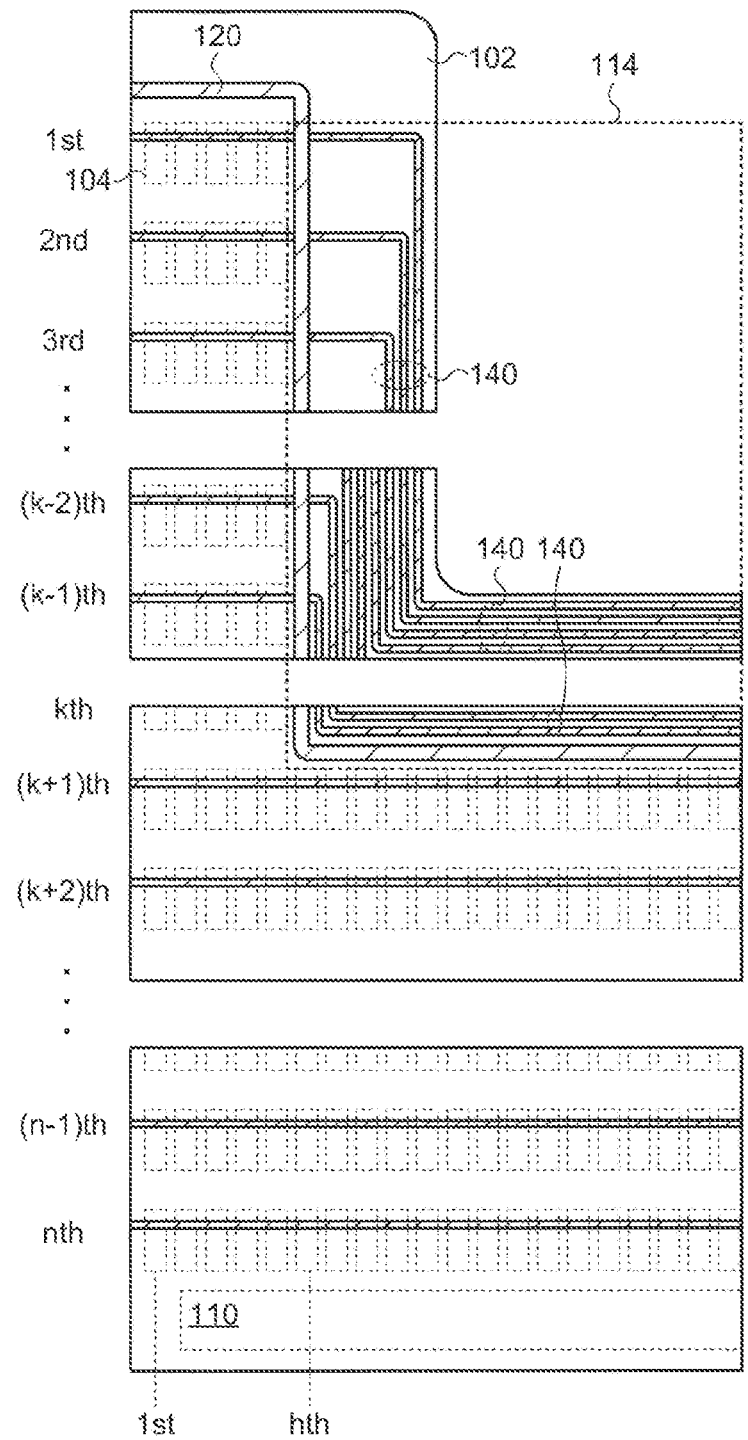
FIG. 5 is a schematic top view of a display device according to an embodiment of the present invention.
Figure 6:
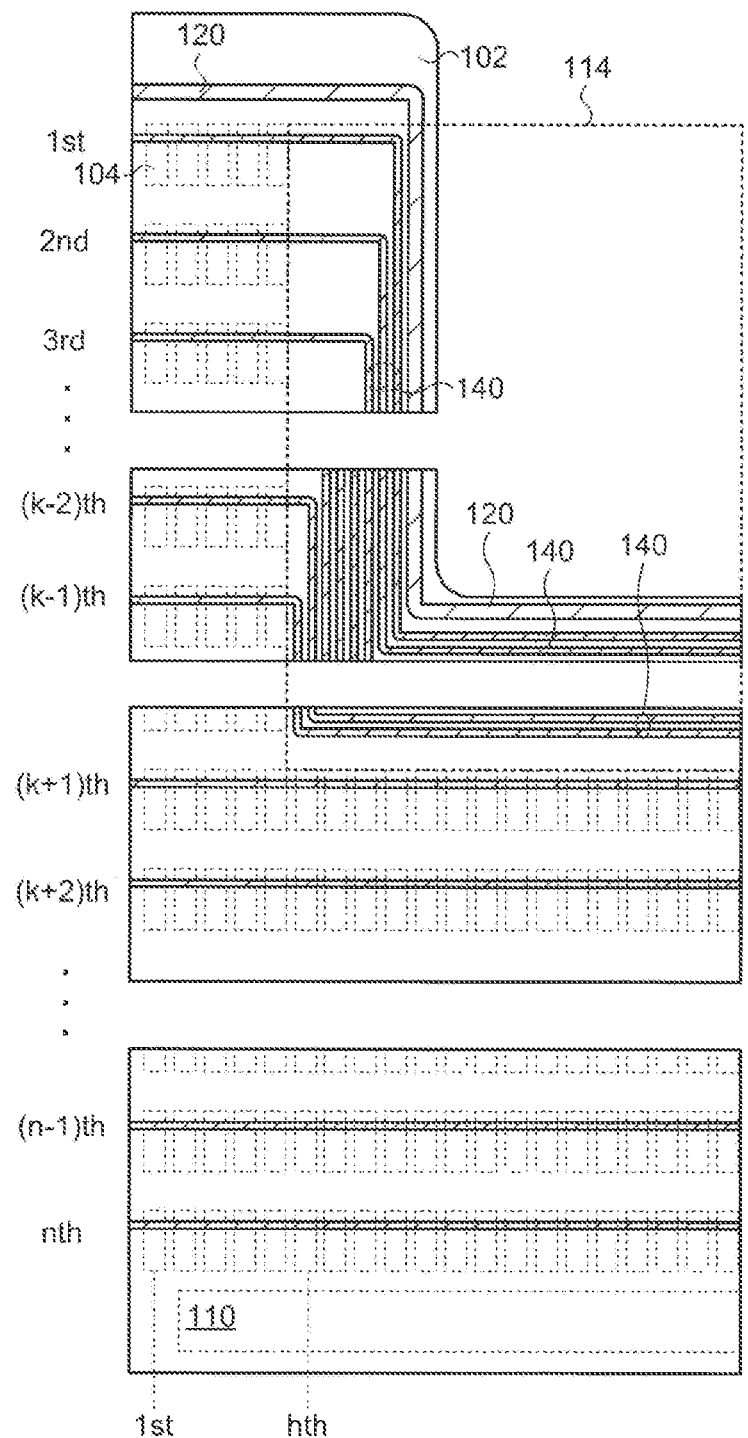
FIG. 6 is a schematic top view of a display device according to an embodiment of the present invention.

In the example shown in FIG. 5, a part of the high-potential power-source line 120 is located between the kth scanning line 140 and the (k+1)th scanning line 140 in at least a part of the hth to ith columns, and another part intersects the first to kth scanning lines 140 in the cutoff 114. However, the arrangement of the high-potential power-source line 120 is not limited thereto, and the high-potential power-source line 120 may be arranged so as not to overlap with the first to kth scanning lines 140 in the cutoff 114. In this case, the high-potential power-source line 120 extends between the first scanning line 140 and a side of the cutoff 114 in a part of the hth to ith columns.

The number of the pixels 104 connected to each of the first to kth scanning lines 140 is smaller than that of the pixels 104 connected to each of the (k+1)th to nth scanning lines 140 due to the structure described above. Specifically, the former is smaller than the latter by the number of the pixels 104 which can be arranged in a region overlapping with the cutoff 114. Therefore, the driving load applied to each of the first to kth scanning lines 140 is relatively small compared with that applied to each of the (k+1)th to nth scanning lines 140, and the degree of the signal delay and signal-shape distortion is not the same between the first to kth scanning lines 140 and the (k+1)th to nth signal lines 140 even if pulse signals having the same shape and the same intensity are provided to the scanning lines 140 in the all rows, for example. More specifically, the degree of the signal delay and the signal-shape distortion is smaller in the first to kth scanning lines 140, which enables the light-emitting elements OLED of the pixels 104 in the first (k=1) to kth rows to emit light at a luminance corresponding to or close to the inputted image signal Vsig. In contrast, it is difficult to obtain a luminance corresponding to the image signal Vsig in the pixels 104 in the (k+1) to nth rows. As a result, the luminance of the pixels 104 in the first (k=1) to kth rows is higher than that of the pixels 104 in the (k+1)th to nth rows, which is observed as a luminance unevenness in the display region 106.

Figure 7:
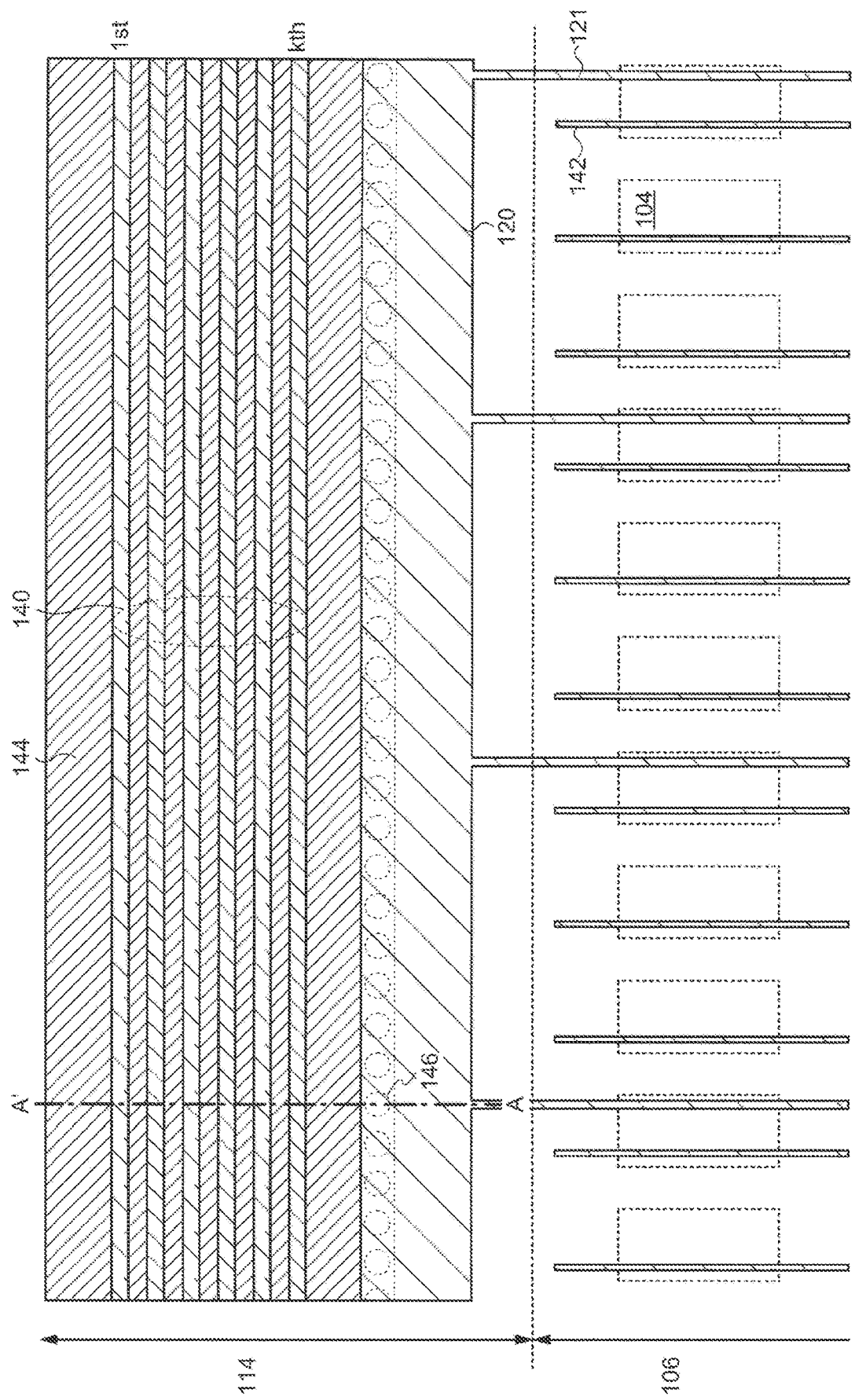
FIG. 7 is a schematic top view of a display device according to an embodiment of the present invention.

In the present embodiment, an adjustment capacitance is added to the first to kth scanning lines 140 so as to be applied with the driving load the same as that of the (k+1) to nth scanning lines 140 in order to prevent a decrease in display quality caused by the luminance unevenness. Specifically, a semiconductor film or a conductive film (hereinafter, collectively referred to as an adjustment film) 144 overlapping with all of or at least a part of the first to kth scanning lines 140 is formed in the cutoff 114 as shown in FIG. 7. The adjustment film 144 is electrically connected to the high-potential power-source line 120 in an opening 146. Thus, the high potential PVDD is applied to the adjustment film 144. The adjustment film 144 may exist in the same layer as the semiconductor films of the transistors in the pixel circuit (e.g., the semiconductor film 160 of the driving transistor DRT). In this case, the adjustment film 144 may include silicon, for example, and crystallinity thereof may be the same as that of the semiconductor film 160. For example, the semiconductor film 160 and the adjustment film 144 are each an amorphous silicon film or a polysilicon film. Moreover, the adjustment film 144 is doped with impurities. Here, it is preferred that the adjustment film 144 is doped with impurities imparting a p-type conductivity, such as boron and aluminum, because the high potential PVDD is applied to the adjustment film 144. A concentration of the impurities may be higher than that of the low-concentration impurity regions 160c and may be the same as or larger than that of the source/drain regions 160b.

Figure 8:
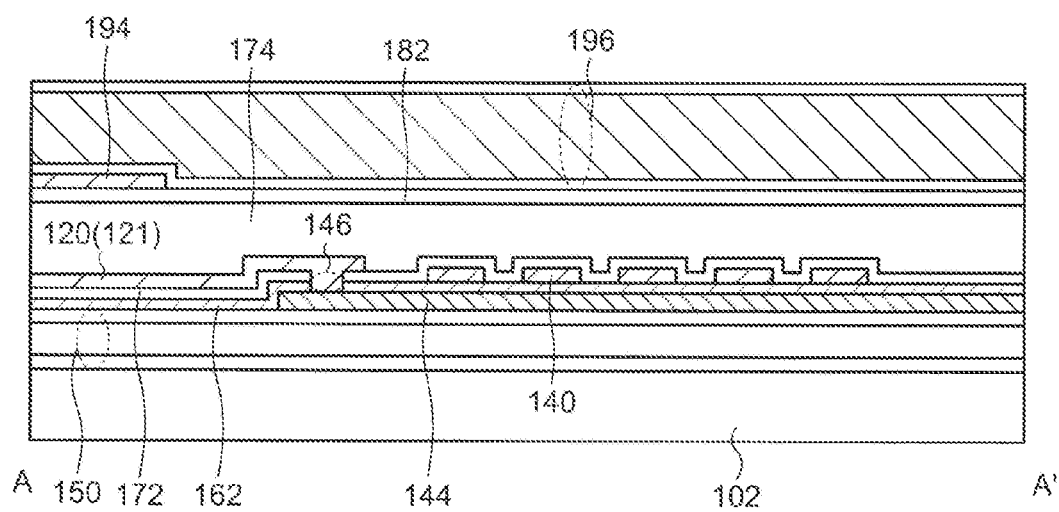
FIG. 8 is a schematic cross-sectional view of a display device according to an embodiment of the present invention.

A schematic view of a cross section along a chain line A-A' in FIG. 7 is shown in FIG. 8. As shown in FIG. 8, the opening 146 is formed in the gate insulating film 162 and the interlayer insulating film 172, by which the adjustment film 144 and the high-potential power-source line 120 are electrically connected to each other. The adjustment film 144 is also electrically connected to the current-supplying lines 121 extending in the column direction because the high-potential power-source line 120 is electrically connected to the current-supplying lines 121 (see FIG. 7). Furthermore, the adjustment film 144 and the scanning line 140 overlap with each other through the gate insulating film 162 to result in parasitic capacitance C in the scanning lines 140, which allows a product CR of the parasitic capacitance C and the resistance R of the scanning line 140 to be applied to all of or a part of the first to kth scanning lines 140 as an adjusting load. This structure enables the driving load applied to each of the first to kth scanning lines 140 to be adjusted so as to be substantially the same degree as that applied to each of the (k+1)th to nth scanning lines 140. Accordingly, the light-emitting elements OLED can be driven at the luminance corresponding to or close to the image signal Vsig in the whole of the display region, thereby preventing reduction in display quality.

Figure 9:
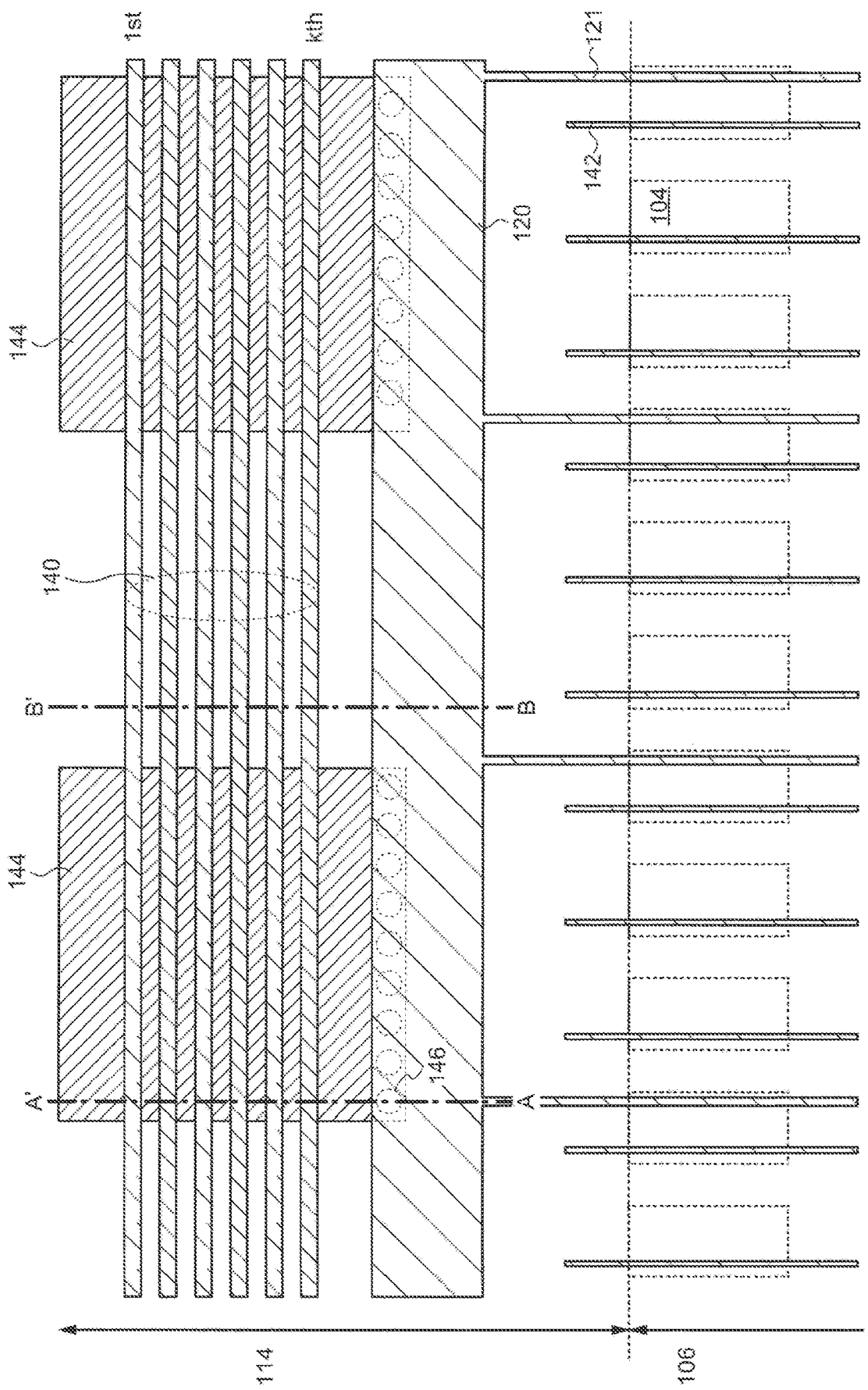
FIG. 9 is a schematic top view of a display device according to an embodiment of the present invention.
Figure 10:
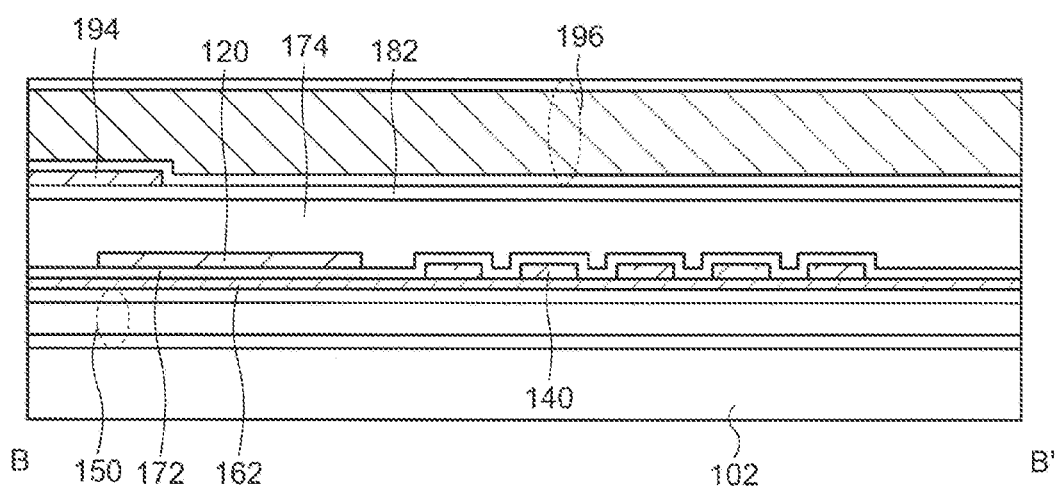
FIG. 10 is a schematic cross-sectional view of a display device according to an embodiment of the present invention.

As shown in FIG. 9, a plurality of adjustment films 144 may be provided. In this case, areas of the adjustment films 144 may be the same as or different from one another. Formation of the plurality of adjustment films 144 allows the parasitic capacitance C to be adjusted and the driving load to be more accurately controlled. In such a structure, the gate insulating film 162 is in contact with the undercoat 150 in a region where the adjustment films 144 are not formed as demonstrated by a schematic view (FIG. 10) of a cross section along a chain line B-B'.

Figure 11:
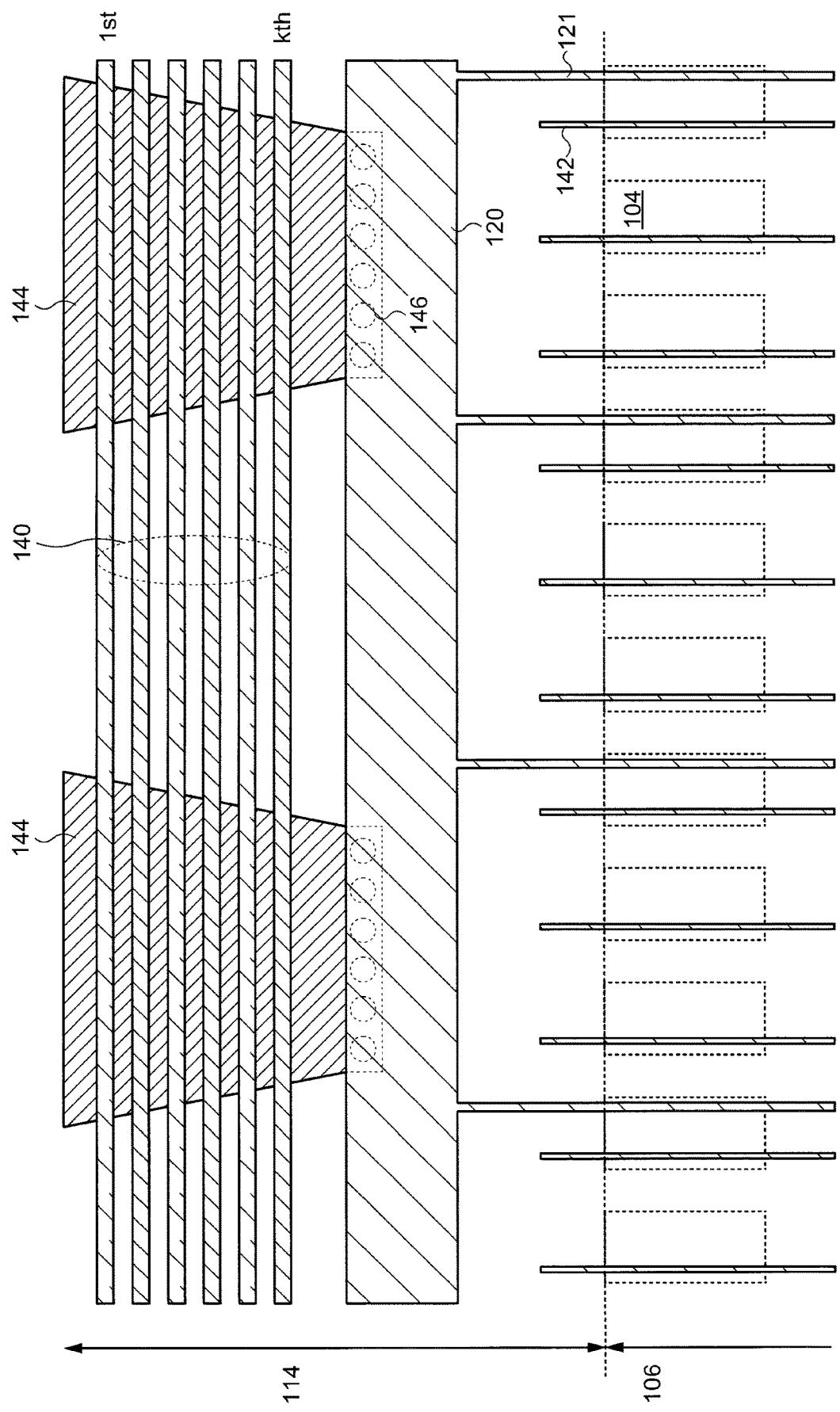
FIG. 11 is a schematic top view of a display device according to an embodiment of the present invention.
Figure 12:
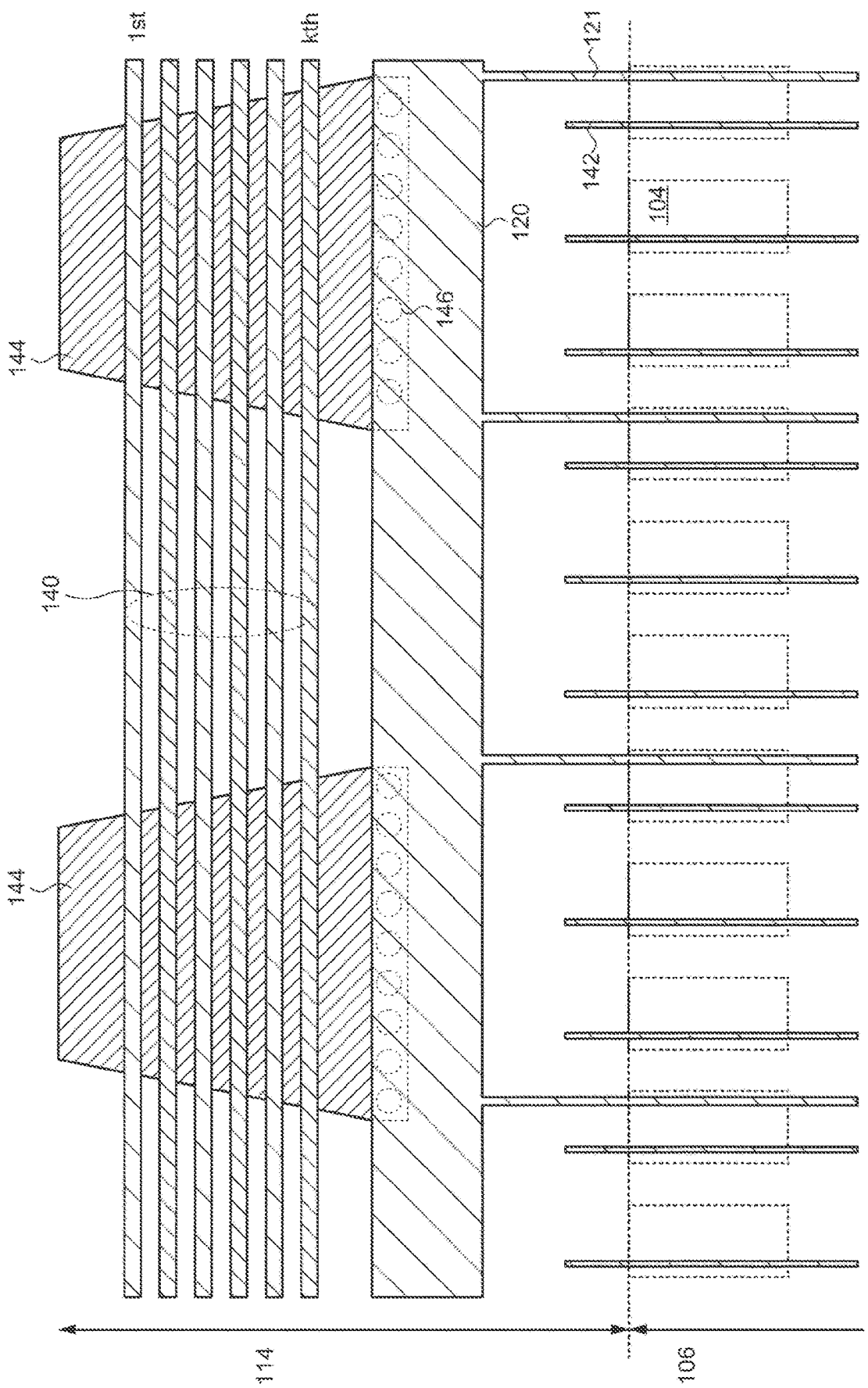
FIG. 12 is a schematic top view of a display device according to an embodiment of the present invention.

As shown in FIG. 11 and FIG. 12, the shape of the adjustment film 144 is not limited to a rectangle or square, and a side of the adjustment film 144 overlapping with the scanning lines 140 may be inclined from the scanning lines 140. For example, the adjustment film 144 may be a trapezoidal shape. Similarly, the adjustment film 144 may be formed so that the areas of the adjustment film 144 overlapping with the first to kth scanning lines 140 are changed stepwise as shown in FIG. 13. This structure enables the areas overlapping with adjustment film 144 to be different between the first to kth scanning lines 140.

As shown in FIG. 5, all of or a part of the first to kth scanning lines 140 is bent to detour around the cutoff 114. Therefore, the first scanning line 140 is farthest from the side of the cutoff 114 parallel to the row direction and longer than the second to kth scanning lines. In general, the (j+1)th scanning line 140 is shorter than the jth scanning line 140 (j is a natural number smaller than k). Hence, the resistance of the first to kth scanning lines decreases in this order, and the driving load applied thereto also decreases in this order. In this case, it is possible to adjust the driving load applied to these scanning lines to be the same by increasing the areas overlapping with the adjustment film 144 in the order from the first to kth scanning lines 140. For instance, the adjusting load can be gradually increased in the order from the first to kth scanning lines 140 by providing a plurality of trapezoidal adjustment films 140 so that a longer bottom selected from the lower bottom and the upper bottom is arranged to be closer to the display region 106 as shown in FIG. 12. Note that, when the resistance and the parasitic capacitance of the first to kth scanning lines 140 increase in this order due to another reason, the adjustment film 144 may be formed so that the areas overlapping with the adjustment film 144 decreases in the order from the first to kth scanning lines 140 as shown in FIG. 11.

As described above, in the display region 106 having the cutoff 114, the driving load applied to the scanning lines 140 of the pixels 104 located in the rows intersecting the cutoff 114 is smaller than that of the scanning lines 140 of the pixels 104 located in the rows which do not intersect the cutoff 114, which leads to a display unevenness. However, the formation of the adjustment film 144 for adjusting the parasitic capacitance of the scanning lines 140 allows the driving load applied to the scanning lines 140 to be adjusted to be substantially the same in the entire display region 106. As a result, the display unevenness can be suppressed, and a display device capable of displaying a high-quality image can be provided.

Second Embodiment

In the present embodiment, a manufacturing method of the display device 100 is explained using FIG. 14A to FIG. 18B. In these drawings, the left-side figures show the pixel 104 and correspond to a part of the cross-sectional view in FIG. 4, while the right-side figures are cross-sectional views of the cutoff 114 and correspond to FIG. 8. An explanation of the structures the same as or similar to those of the First Embodiment may be omitted.

The undercoat 150 and the light-shielding film 152 are formed over the substrate 102. Here, an example having the three-layer structure described in the First Embodiment is demonstrated for the undercoat 150 (FIG. 14A). Specifically, after the film 150a containing silicon oxide is formed over the substrate 102, the light-shielding film 152 is prepared. Next, the film 150b containing silicon nitride and the film 150c containing silicon oxide are sequentially formed. The film 150a containing silicon oxide, the film 150b containing silicon nitride, and the film 150c containing silicon oxide can be formed by a chemical vapor deposition (CVD) method or a sputtering method. The light-shielding film 152 may include molybdenum, chromium, tungsten, or the like and is formed with a CVD method or a sputtering method.

Next, the semiconductor film 160 and the adjustment film 144 are fabricated over the undercoat 150 (FIG. 14B). These films may be formed with a CVD method using silane gas or the like as a raw material. A heating treatment or irradiation with light such as a laser may be performed to crystalize the resulted amorphous silicon. The semiconductor film 160 and the adjustment film 144 are simultaneously prepared, and therefore, exist in the same layer.

Next, a resist mask which is not illustrated is formed to cover the semiconductor film 160, and the doping (first doping) of the adjustment film 144 is carried out. Here, doping is carried out on the adjustment film 144 using a dopant imparting a p-type conductivity, such as aluminum and boron. With this process, a conductivity is provided to the adjustment film 144.

After that, a resist mask which is not illustrated is formed over the regions where the channel region 160a and the low-concentration impurity regions 160c are to be formed over the adjustment film 144, and then doping (second doping) is performed on the semiconductor film 160 to form the source/drain regions 160b (FIG. 14C). At this time, a dopant imparting a n-type conductivity, such as phosphorus or nitrogen, is used, by which the driving transistor DRT can be fabricated as a n-channel type transistor.

Next, the gate insulating film 162 is prepared so as to cover the semiconductor film 160 and the adjustment film 144 (FIG. 15A). Similar to the undercoat 150, the gate insulating film 162 also includes one or a plurality of films containing silicon nitride or silicon oxide and is formed by applying a CVD method or a sputtering method. Next, the gate electrode 164 and the capacitor electrode 170 are formed over the gate insulating film 162 using a sputtering method or a CVD method (FIG. 15A). At this time, the variety of scanning lines (the write-controlling scanning line 128, the initialization-controlling scanning line 130, the compensation-controlling scanning line 132, the emission-controlling scanning line 134, the reset-controlling line 136, and the like) 140 is formed, while the first to kth scanning lines 140 are formed so as to overlap with the adjustment film 144 through the gate insulating film 162 (FIG. 15A). Therefore, the gate electrode 164 and the scanning lines 140 exist in the same layer. As a metal included in the gate electrode 164, the capacitor electrode 170, and the scanning lines 140, titanium, aluminum, copper, molybdenum, tungsten, tantalum, and an alloy thereof are represented. These electrodes and wirings may have a single-layer structure of a stacked-layer structure. For example, a structure may be employed where a metal with high conductivity, such as copper or aluminum, is sandwiched by a metal having a high melting point, such as molybdenum or titanium.

After that, a resist mask is formed to cover the adjustment film 144, and doping (third doping) is performed on the semiconductor film 160 by additionally using the gate electrode 164 as a mask. At this time, the same dopant as the second dopant for the semiconductor film 160 is used, and the semiconductor film 160 is doped at a lower concentration than that of the second doping. With this process, the low-concentration impurity regions 160c are formed in addition to the channel region 160a overlapping with the gate electrode 164 (FIG. 15B). Note that this third doping may be conducted without forming the resist mask over the adjustment film 144.

Figure 16A:
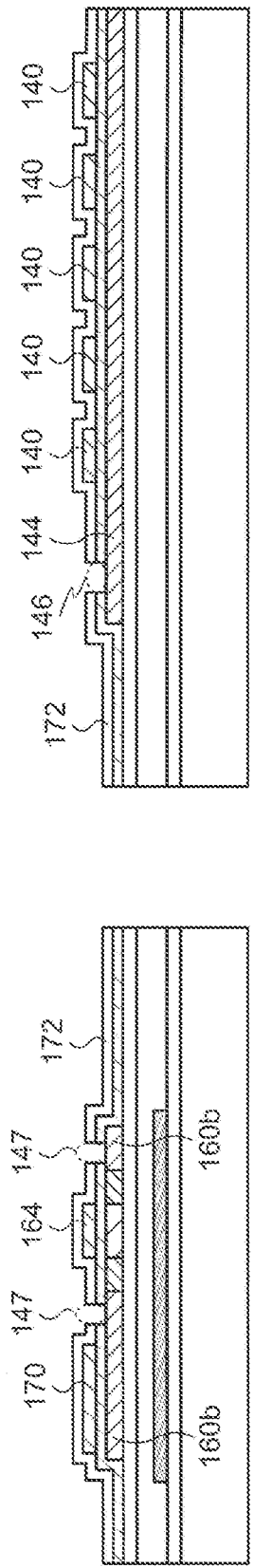
FIG. 16A and FIG. 16B are schematic cross-sectional views showing a manufacturing method of a display device according to an embodiment of the present invention.

Next, the interlayer insulating film 172 is formed over the gate electrode 164, the capacitor electrode 170, and the scanning lines 140 (FIG. 16A). The interlayer insulating film 172 also contains the material usable for the undercoat 150 and the gate insulating film 162 and may be formed by applying a CVD method or a sputtering method so as to have a single-layer structure or a stacked-layer structure. Etching is successively performed on the interlayer insulating film 172 and the gate insulating film 162 to form the openings 147 reaching the source/drain regions 160b and the openings 146 reaching the adjustment film 144 (FIG. 16A). The openings 146 and 147 may be prepared by conducting plasma etching in a gas including a fluorine-containing hydrocarbon, for example.

Figure 16B:
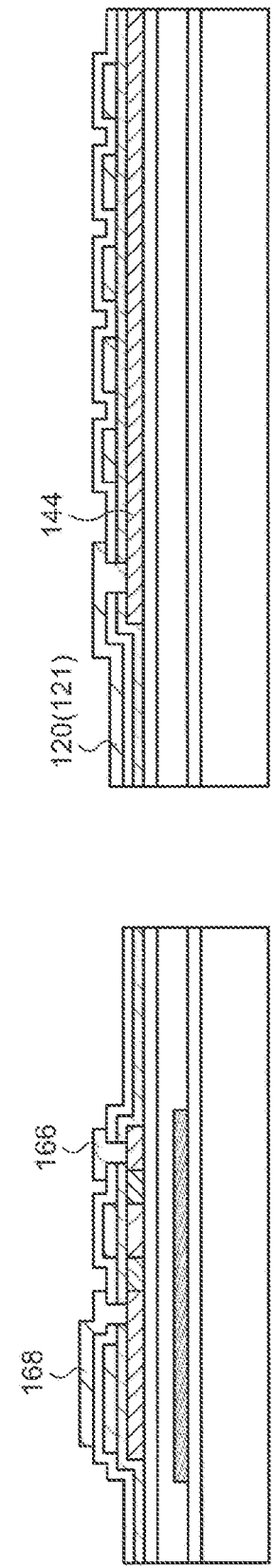

Next, a metal film is prepared to cover these openings 146 and 147 and processed by etching to form the source/drain electrodes 166 and 168 (FIG. 16B). At this time, the high-potential power-source line 120, the low-potential power-source line 122, and current-supplying lines 121 are formed in addition to the first signal lines 124 and the second signal lines 126, and the high-potential power-source line 120 is electrically connected to the adjustment film 144 (FIG. 16B) through the openings 146 (see FIG. 16A).

Next, the leveling film 174 is prepared to cover the driving transistor DRT, the storage capacitor Cs, the high-potential power-source line 120, and the like (FIG. 17A). The leveling film 174 includes a polymer material such as an epoxy resin, an acrylic resin, a polyimide, a polyester, or a polycarbonate may be formed by applying a spin-coating method, an ink-jet method, a printing method, a dip-coating method, or the like. After that, etching is carried out on the leveling film 174 to form the opening reaching the source/drain electrode 168.

Next, the connection electrode 176 is formed so as to cover the opening exposing the source/drain electrode 168, and the supplementary capacitor electrode 180 is formed over the leveling film 174 (FIG. 17A). The connection electrode 176 and the supplementary capacitor electrode 180 can be formed by sputtering a conductive oxide, for example. After that, the supplementary capacitor insulating film 182 is formed so as to cover the connection electrode 176 and the supplementary capacitor electrode 180 (FIG. 17B). The supplementary capacitor insulating film 182 may also include an inorganic compound such as silicon nitride and silicon oxide and is formed by applying a CVD method or a sputtering method. The supplementary capacitor insulating film 182 has an opening exposing a part of the top surface of the connection electrode 176. In this opening, the electrical contact between the pixel electrode 190 of the light-emitting element OLED and the connection electrode 176 is realized. The supplementary capacitor insulating film 182 may be disposed in the region where the first to kth scanning lines 140 are provided (FIG. 17B).

Figure 18A:
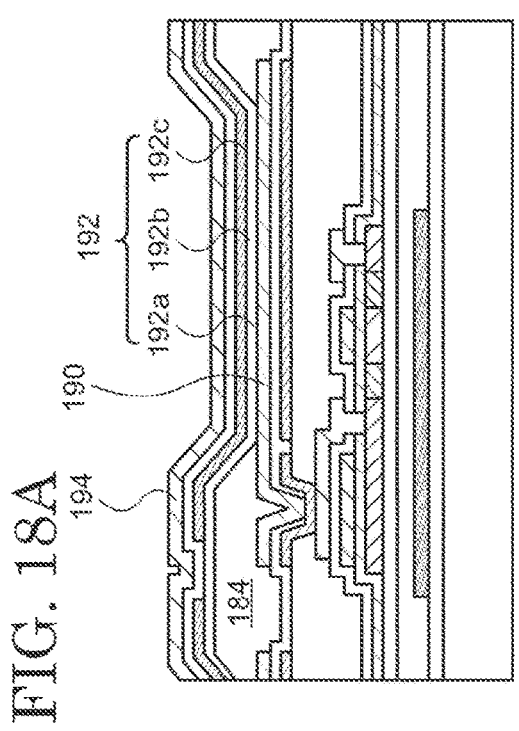
FIG. 18A and FIG. 18B are schematic cross-sectional views showing a manufacturing method of a display device according to an embodiment of the present invention.

Next, the pixel electrode 190 is formed by utilizing a sputtering method or a CVD method so as to be in contact with the connection electrode 176 and overlap with the supplementary capacitor electrode 180 (FIG. 17B). After that, the partition wall 184 is formed to cover the edge portion of the pixel electrode 190 (FIG. 18A). The partition wall 184 may be formed using a polymer material such as an epoxy resin or an acrylic resin with a spin-coating method, an ink-jet method, or the like. The partition wall 184 absorbs steps caused by the pixel electrode 190 and electrically insulates the pixel electrodes 190 in the adjacent pixels 104 from each other.

Next, the EL layer 192 and the opposing electrode 194 of the light-emitting element OLED are formed so as to cover the pixel electrode 190 and the partition wall 184 (FIG. 18A). The EL layer 192 is formed by applying an ink-jet method, a printing method, or a dry-type film-formation method such as an evaporation method. The opposing electrode 194 is also prepared by utilizing a sputtering method or an evaporation method. The EL layer 192 and the opposing electrode 194 are formed so as not to overlap with the first to kth scanning lines 140 and the high-potential power-source line 120 in the example demonstrated in FIG. 18A. However, the EL layer 192 and the opposing electrode 194 may be prepared so that one or both of them overlap with the scanning line 140 and a part of the high-potential power-source line 120.

Next, the passivation film 196 is prepared. The passivation film 196 may be formed not only in the display region 106 but also in a part of the cutoff 114. Therefore, the passivation film 196 may overlap with all of or a part of the first to kth scanning lines 140.

Figure 18B:
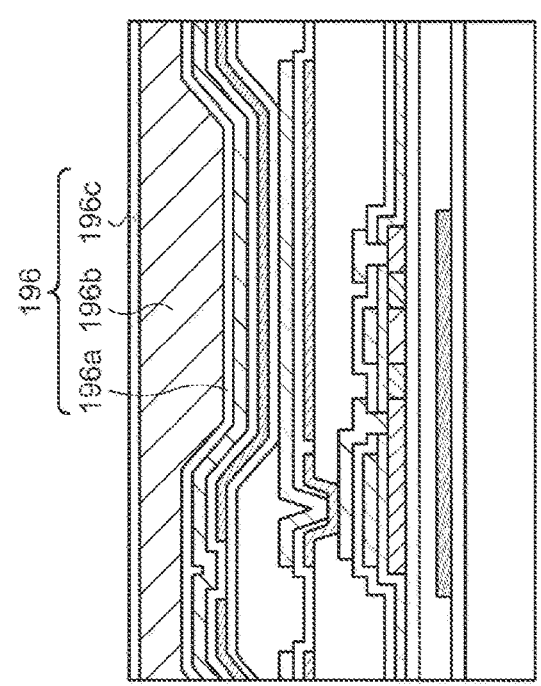

When the passivation film 196 has a three-layer structure as illustrated in FIG. 18B, the first layer 196a is first prepared so as to cover the opposing electrode 194. The first layer 196a may be formed to be in contact with the opposing electrode 194. The first layer 196a includes an inorganic material such as silicon oxide and silicon nitride and is formed by applying a CVD method or a sputtering method.

Next, the second layer 196c is prepared. The second layer 196b may be formed at a thickness sufficient to absorb depressions and projections caused by the partition wall 184 and provide a flat surface. The second layer 196b may be formed with a printing method, an ink-jet method, a spin-coating method, or the like. Alternatively, the second layer 196b may be prepared by atomizing or gasifying oligomers serving as a row material of the resin described in the First Embodiment under a reduced pressure, spraying the first layer 196a with the oligomers, and then polymerizing the oligomers.

After that, the third layer 196c is formed. The third layer 196c may include the material usable for the first layer 196a and may be formed with the method applicable for the formation of the first layer 196a.

The display device 100 is manufactured with the processes described above. As described above, the adjustment film 144 for adjusting the driving load applied to the scanning lines 140 can be simultaneously prepared with the semiconductor films 160 of the transistors in the pixel circuit. Hence, the display device 100 can be provided without any additional stress on the process.

Third Embodiment

In the present embodiment, a display device 200 different in structure from the display device 100 is explained. An explanation of the contents the same as or similar to those described in the First and Second Embodiments may be omitted.

In the display device 100, the adjustment film 144 is provided in the cutoff 114 in order to adjust the driving load applied to the first to kth scanning lines 140. This adjustment film 144 exists in the same layer as the semiconductor films of the transistors in the pixel circuit. On the other hand, the display device 200 is different from the display device 100 in that a part of the high-potential power-source line 120 instead of the adjustment film 144 overlaps with all of or a part of the first to kth scanning lines 140 as shown in FIG. 19. In other words, the metal film which is a part of the high-potential power-source line 120 overlaps with all of or a part of the first to kth scanning lines 140, by which an adjusting load is provided to adjust the driving load.

Figure 20:
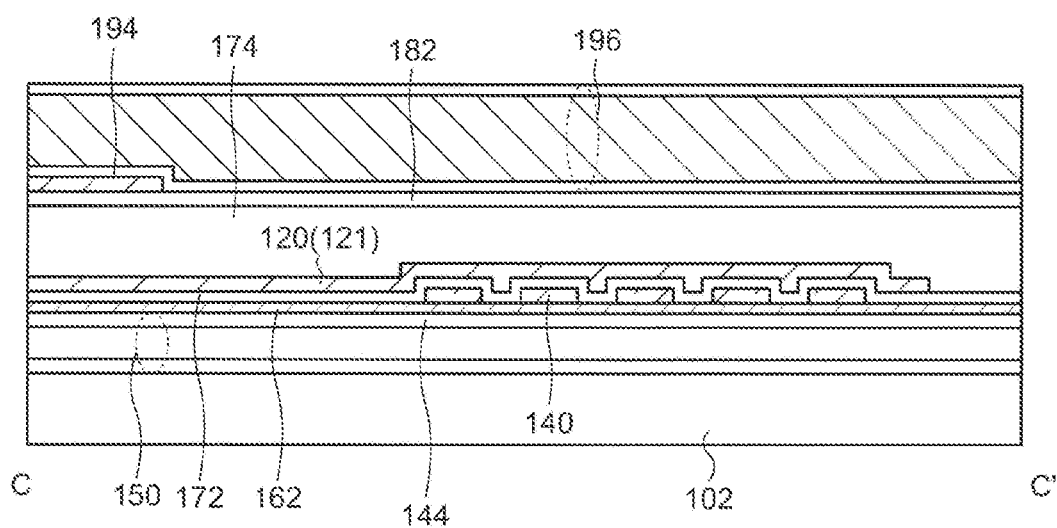
FIG. 20 is a schematic cross-sectional view of a display device according to an embodiment of the present invention.

A schematic view of a cross section along a chain line C-C' in FIG. 19 is shown in FIG. 20. As shown in FIG. 20, the high-potential power-source line 120 is disposed over all or a part of the first to kth scanning lines 140 through the interlayer insulating film 172. Thus, the adjustment capacitance provided to the first to kth scanning lines 140 is formed by a part of the high-potential power-source line 120 and the interlayer insulating film 172. With this structure, substantially the same driving load is applied to all of the scanning lines 140 in the entire display region 106, thereby preventing a display unevenness and providing a display device capable of displaying a high-quality image.

In the display device 200, the high-potential power-source line 120 formed to generate this adjustment capacitance can be formed when the source/drain electrodes of the transistor (e.g., the source/drain electrodes 166 and 168) are prepared in the pixel circuit. Hence, it is possible to produce the display device 200 without making the manufacturing process complex.

Fourth Embodiment

In the present embodiment, a display device 210 different in structure from the display devices 100 and 200 is explained. An explanation of the contents the same as or similar to those described in the First to Third Embodiments may be omitted.

Similar to the display device 100, the display device 210 possesses a plurality of adjustment films 144. However, the display device 210 is different from the display device 100 in that a part of one or both of the first signal line 124 and the second signal line 126 (hereinafter, these lines are collectively referred to as a signal line 142) is located between the adjacent adjustment films 144.

Figure 21:
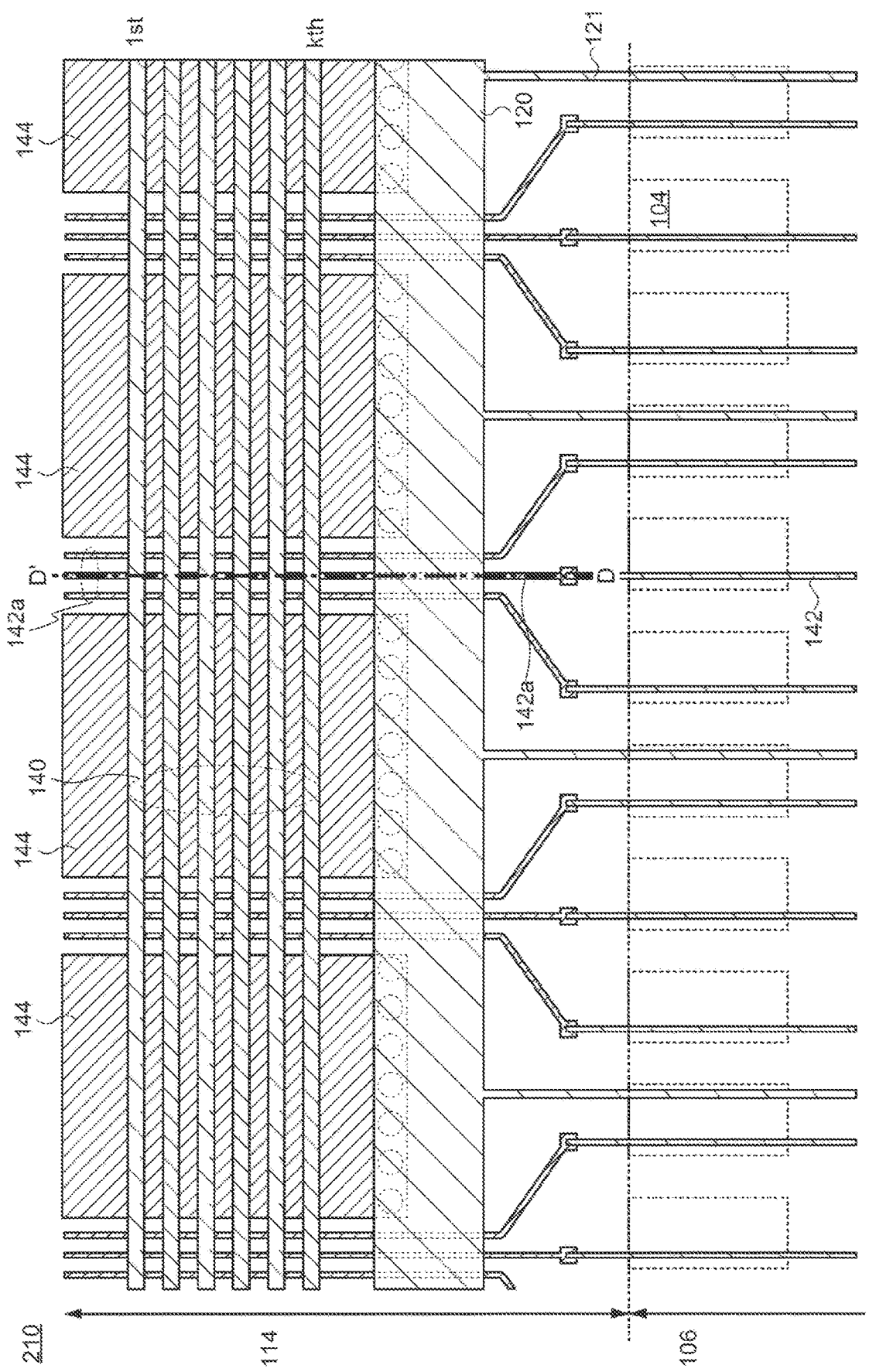
FIG. 21 is a schematic top view of a display device according to an embodiment of the present invention.

Specifically, a portion (a first extending portion 142a) of the signal lines 142 (hth to ith signal lines 142) disposed in the columns (i.e., hth to ith columns) intersecting the cutoff 114 is covered by the high-potential power-source line 120 and is positioned in a region sandwiched by two adjacent adjustment films 144 as shown in FIG. 21. The number of the signal lines 142 sandwiched by the two adjustment films 144 is not limited. As shown in FIG. 21, the display device 210 may be configured so that the first extending portions 142a connected to the pixels 104 in the continuing three columns are positioned in the region sandwiched by two adjustment films 144. Alternatively, the display device 210 may be configured so that the first extending portions 142a connected to the pixels 104 in one, two, four or more columns are positioned in the region sandwiched by two adjacent adjustment films.

Figure 22:
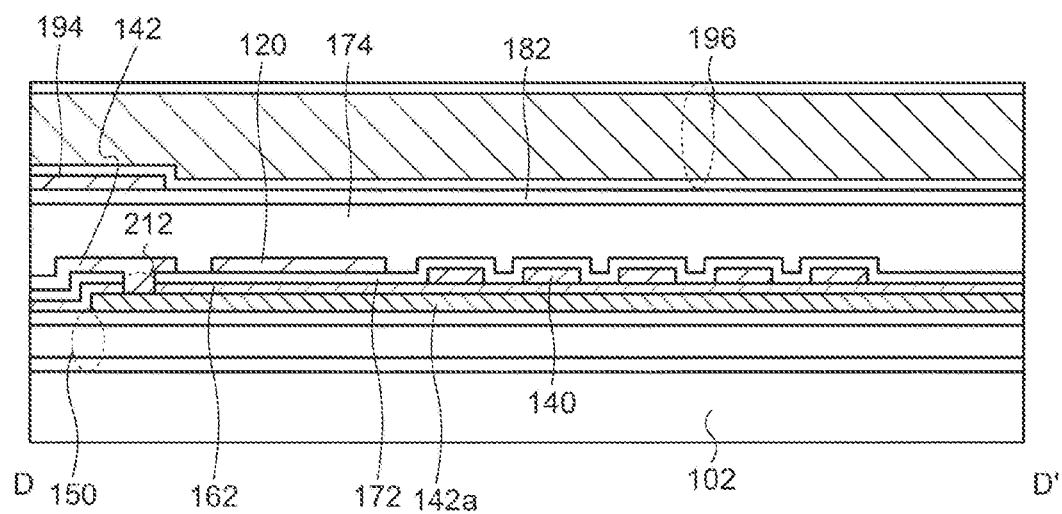
FIG. 22 is a schematic cross-sectional view of a display device according to an embodiment of the present invention.

A schematic view of a cross section along a chain line D-D' of FIG. 21 is shown in FIG. 22. As shown in FIG. 22, an opening 212 is formed in the gate insulating film 162 and the interlayer insulating film 172, and the signal line 142 extending from the display region 106 is connected, in the opening 212, to the first extending portion 142a which exists in a different layer from the signal line 142 and functions as a part of the signal line 142. The first extending portion 142a is partly covered by the high-potential power-source line 120 through the gate insulating film 162 and the interlayer insulating film 172 and further overlaps with the scanning lines 140 through the gate insulating film 162. The first extending portion 142a is prepared in the same process and exists in the same layer as the adjustment film 144. Therefore, the first extending portion 142a includes silicon and has a conductivity substantially the same as that of the adjustment film 144. The signals applied to the signal line 142 are also applied to the first extending portion 142a. Hence, parasitic capacitance is generated in the signal line 142 by the gate insulating film 162, the interlayer insulating film 172, the high-potential power-source line 120, and the scanning lines 140. Additionally, the pixels 104 arranged in the columns intersecting the cutoff 114 and the pixels 104 arranged in the columns which do not intersect the cutoff 114 each intersect the same number of the scanning lines 140. Hence, it is possible to apply substantially the same driving load to all of the signal lines 142 in the entire display region 106, thereby suppressing generation of a display unevenness.

Figure 23:
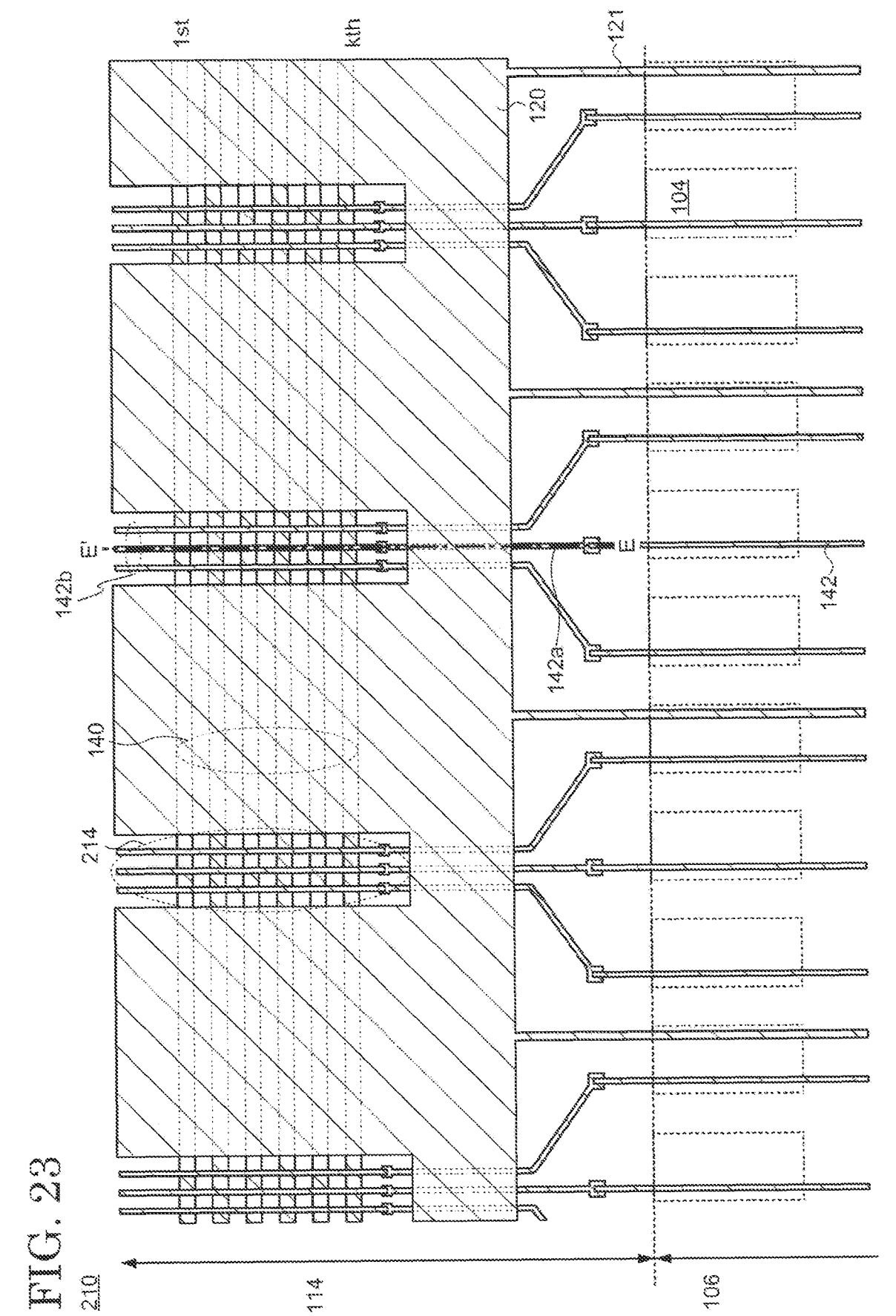
FIG. 23 is a schematic top view of a display device according to an embodiment of the present invention.

Similar to the display device 200 according to the Third Embodiment, the structure may be also employed in the display device 210 in which the adjustment film 144 is not provided, but a part of the high-potential power-source line 120 overlaps with all of or a part of the first to kth scanning lines 140 as shown in FIG. 23. In this case, cutoffs 214 are formed in the high-potential power-source line 120, and the scanning lines 140 are covered by the high-potential power-source line 120 between the adjacent cutoffs 214.

Figure 24:
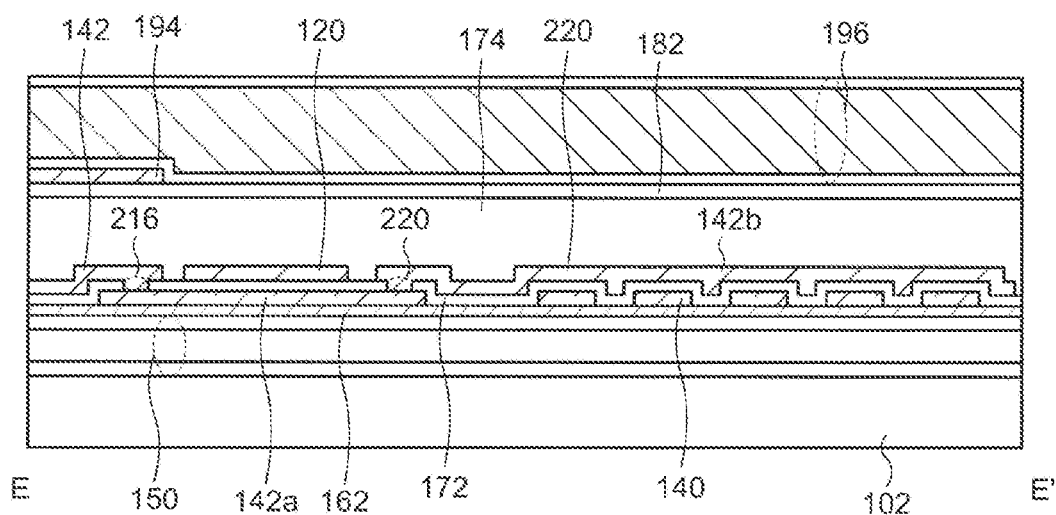
FIG. 24 is a schematic cross-sectional view of a display device according to an embodiment of the present invention.

A schematic view of a cross section along a chain line E-E' in FIG. 23 is shown in FIG. 24. Openings 216 and 220 are formed in the interlayer insulating film 172. The signal line 142 extending from the display region 106 is connected, in the opening 216, to the first extending portion 142a which exists in a different layer from the signal line 142 and functions as a part of the signal line 142, and the first extending portion 142a is further connected, in the opening 220, to a second extending portion 142b functioning as a part of the signal line 142. The first extending portion 142a exists in the same layer as the gate electrodes of the transistors (e.g., the gate electrode 164 of the driving transistor DRT) in the pixel circuit and overlaps with a part of the high-potential power-source line 120. The signal line 142 and the second extending portion 142b each exist in the same layer as the source/drain electrodes of the transistors (e.g., source/drain electrodes 166 and 168 of the driving transistor DRT) in the pixel circuit. Hence, parasitic capacitance is generated in the signal line 142 by the interlayer insulating film 172, the high-potential power-source line 120, and the scanning lines 140. The use of this parasitic capacitance as the adjustment capacitance enables application of the same driving load to the signal lines 142 of the columns intersecting the cutoff 114 and to the signal lines 142 of the columns which do not intersect the cutoff 114, by which generation of a display unevenness can be suppressed.

Figure 25B:
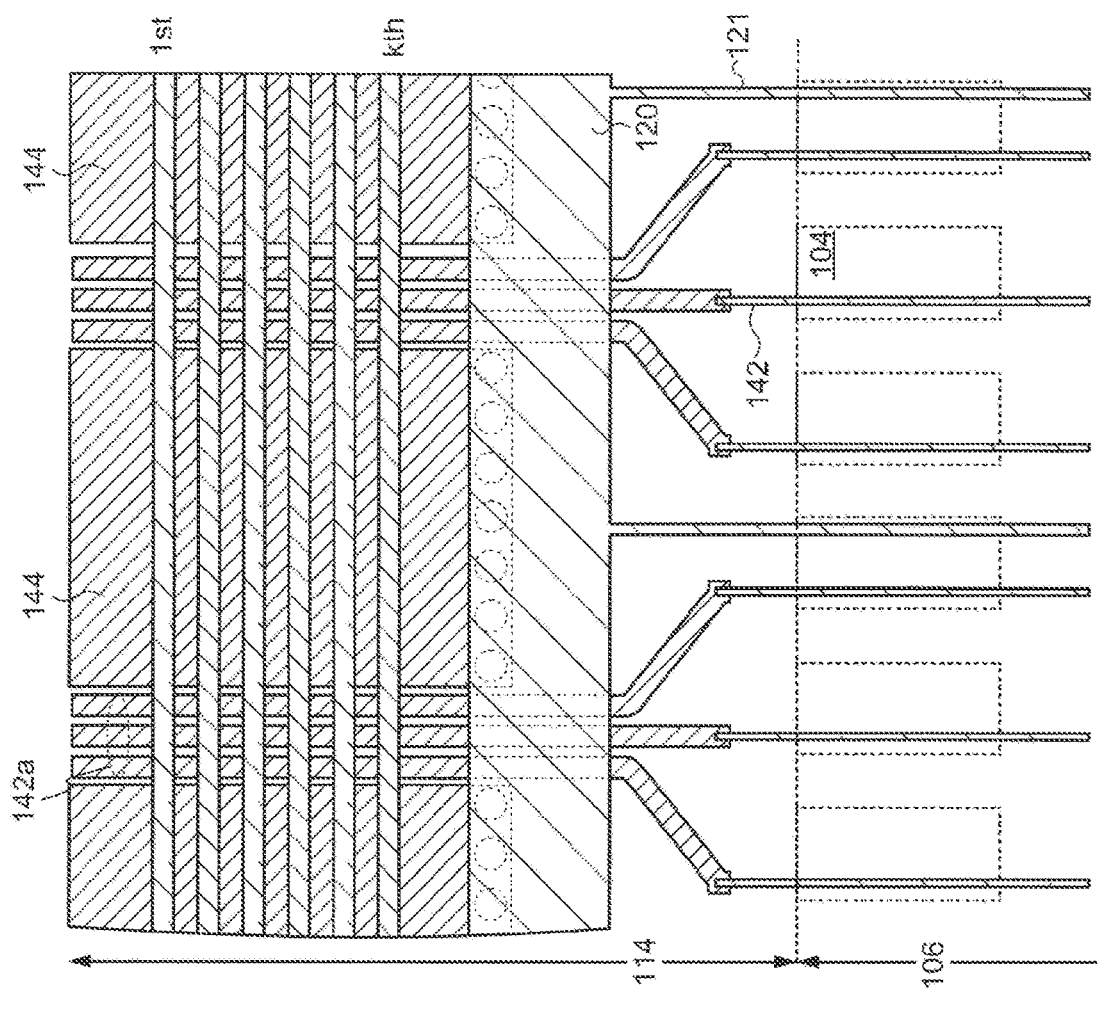
FIG. 25A and FIG. 25B are schematic top views of a display device according to an embodiment of the present invention.
Figure 25A:
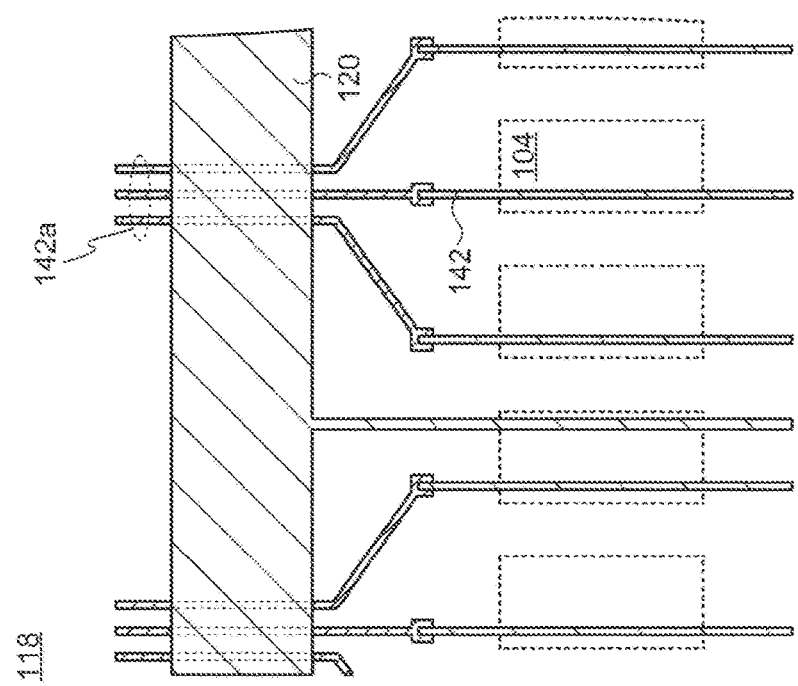

As demonstrated in FIG. 21, in the case where the first extending portion 142a is provided to the signal line 142 and overlaps with the high-potential power-source line 120, the first extending portion 142a of the signal line 142 in the column which does not intersect the cutoff 114 and the first extending portion 142a of the signal line 142 in the column intersecting the cutoff 114 may be different in width from each other. For example, as shown in an enlarged drawing (FIG. 25A) of a region 118 in FIG. 1 and an enlarged drawing (FIG. 25B) of the cutoff 114 and the display region 106 in the vicinity thereof, a width of the first extending portion 142a of the signal line 142 intersecting the cutoff 114 may be larger than a width of the first extending portion 142a of the signal line 142 located in the region 118 (i.e., the signal line 142 connected to the pixels 104 in the column which does not intersect the cutoff 114). With this structure, a much larger adjustment capacitance can be provided to the signal line 142 connected to the pixels 104 in the column intersecting the cutoff 114.

Fifth Embodiment

In the present embodiment, a display device 230 different in structure from the display devices 100, 200, and 210 is explained. An explanation of the contents the same as or similar to those described in the First to Fourth Embodiments may be omitted.

In the display devices 100, 200, and 210, the adjustment film 144 or the metal film serving as a part of the high-potential power-source line 120, which is applied with the high potential PVDD through the interlayer insulating film 172 or the gate insulating film 162, is disposed so as to overlap with all of or a part of the first to kth scanning lines in order to provide the adjustment capacitance to the first to kth scanning lines 140. In contrast, an auxiliary wiring 232 for giving the low potential PVSS to the opposing electrode 194 is used as the adjustment film 144 in the display device 230.

Figure 26:
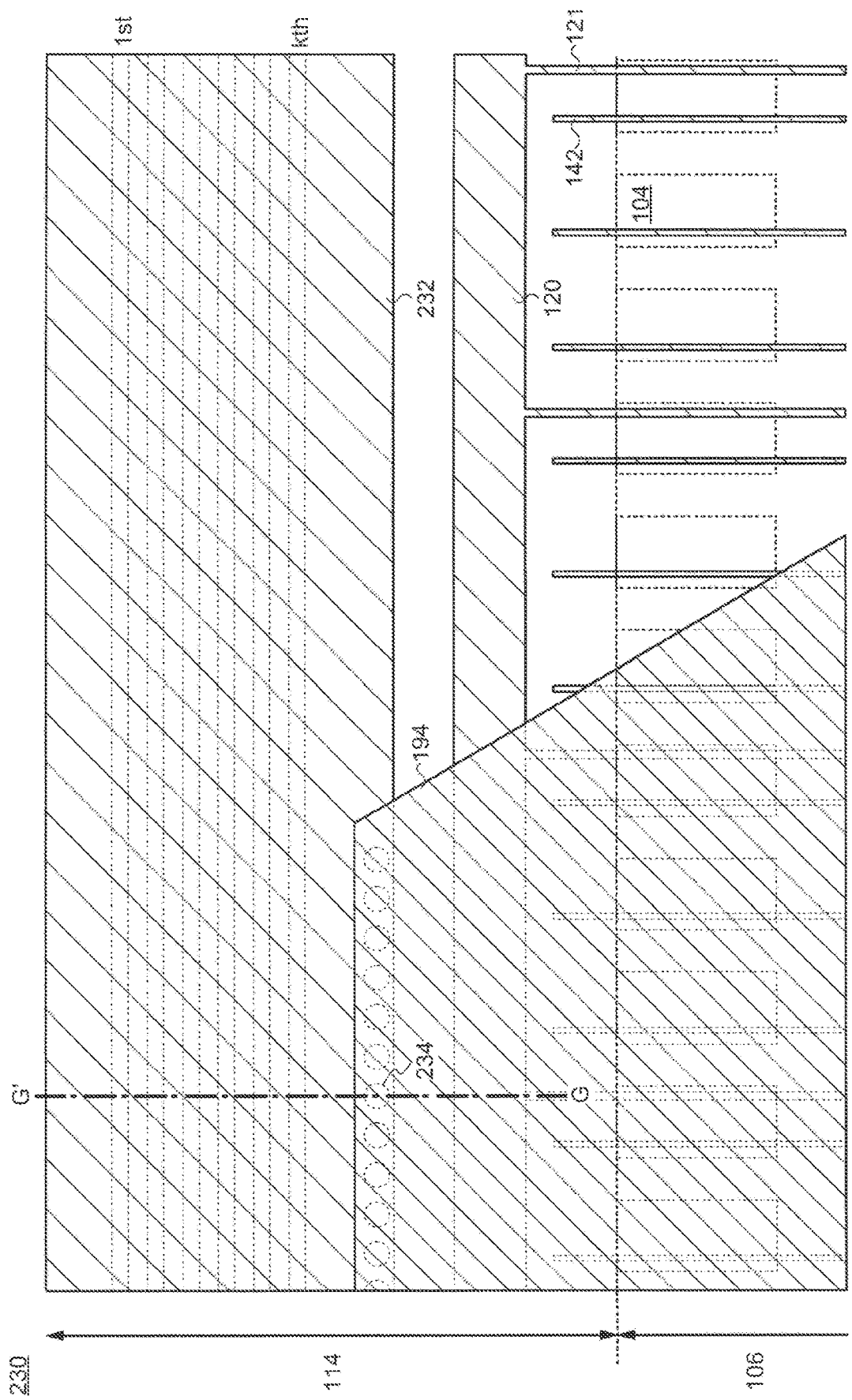
FIG. 26 is a schematic top view of a display device according to an embodiment of the present invention.

A schematic top view of the cutoff 114 and the display region 106 at the vicinity thereof of the display device 230 is shown in FIG. 26. As shown in FIG. 26, the auxiliary wiring 232 connected to the opposing electrode 194 is disposed in the display device 230. The auxiliary wiring 232 is provided in the cutoff 114, and the high-potential power-source line 120 is located between the display region 106 and the auxiliary wiring 232. The opposing electrode 194 extends from the display region 106 to the cutoff 114 and overlaps with the high-potential power-source line 120. In addition, the opposing electrode 194 is electrically connected to the auxiliary wiring 232 in an opening 234.

Figure 27:
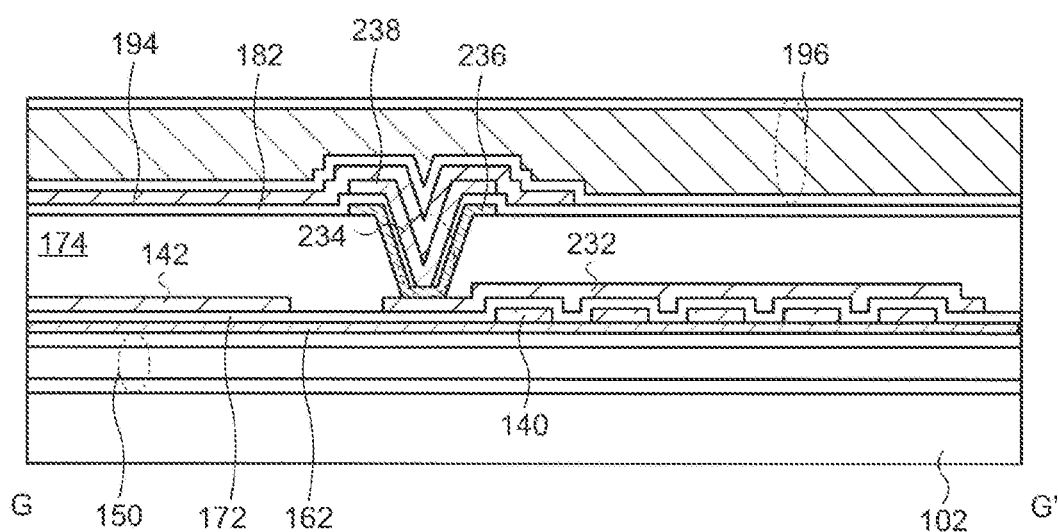
FIG. 27 is a schematic cross-sectional view of a display device according to an embodiment of the present invention.

A schematic view of a cross section along a chain line G-G' in FIG. 26 is illustrated in FIG. 27. The auxiliary wiring 232 is formed so as to overlap with all of or a part of the first to kth scanning lines 140 through the interlayer insulating film 172. The auxiliary wiring 232 exists in the same layer as the signal line 142. The opening 234 is prepared in the leveling film 174 formed over the auxiliary wiring 232 and the signal line 142, and a lower connection electrode 236 is arranged so as to cover this opening 234 and be electrically connected to the auxiliary wiring 232. The lower connection electrode 236 may exist in the same layer as the connection electrode 176 provided in the pixel 104. The supplementary capacitor insulating film 182 is formed over the connection electrode 176. A part of the supplementary capacitor insulating film 182 is removed in the opening 234, thereby exposing a part of a surface of the lower connection electrode 236. An upper connection electrode 238 existing in the same layer as the pixel electrode 190 is arranged over the lower connection electrode 236, and the upper connection electrode 238 and the lower connection electrode 236 are electrically connected to each other in the opening 234. The opposing electrode 194 is formed so as to cover the upper connection electrode 238, which allows the opposing electrode 194 to be electrically connected to the auxiliary wiring 232 through the upper connection electrode 238 and the lower connection electrode 236. Note that, when this structure is employed, the transistors in the pixel circuit (e.g., the driving transistor DRT) are preferably a p-channel type transistor.

As described above, the auxiliary wiring 232 overlaps with all of or a part of the first to kth scanning lines 140 through the interlayer insulating film 172. Therefore, this structure forms the adjustment capacitance for the scanning lines 140 in the rows intersecting the cutoff 114. As a result, substantially the same driving load is applied to all of the scanning lines 140 in the entire display region 106, by which generation of a display unevenness can be suppressed.

As described above, the auxiliary wiring 232 used for producing the adjustment capacitance can be simultaneously prepared when the signal line 142 as well as the source/drain electrodes of the transistors (e.g., the source/drain electrodes 166 and 168 of the driving transistor DRT) in the pixel circuit are formed. Hence, implementation of the present embodiment enables production of a display device capable of displaying a high-quality image without making the manufacturing complex.

Sixth Embodiment

In the present embodiment, a display device 250 different in structure from the display devices 100, 200, 210, and 230 is explained. An explanation of the contents the same as or similar to those described in the First to Fifth Embodiments may be omitted.

Unlike the display devices 100, 200, 210, and 230, the adjustment film 144 is not used to provide the adjustment capacitance to the scanning lines 140 and the signal lines 142 of the pixels 104 located in the rows or columns intersecting the cutoff 114, but a compensating transistor 252 is fabricated at an edge portion of each scanning line 140 in the display device 250. The compensating transistor 252 functions as a variable resistance, and the resistance of each of the aforementioned scanning line 140 is adjusted by using an external circuit or the like.

Figure 28:
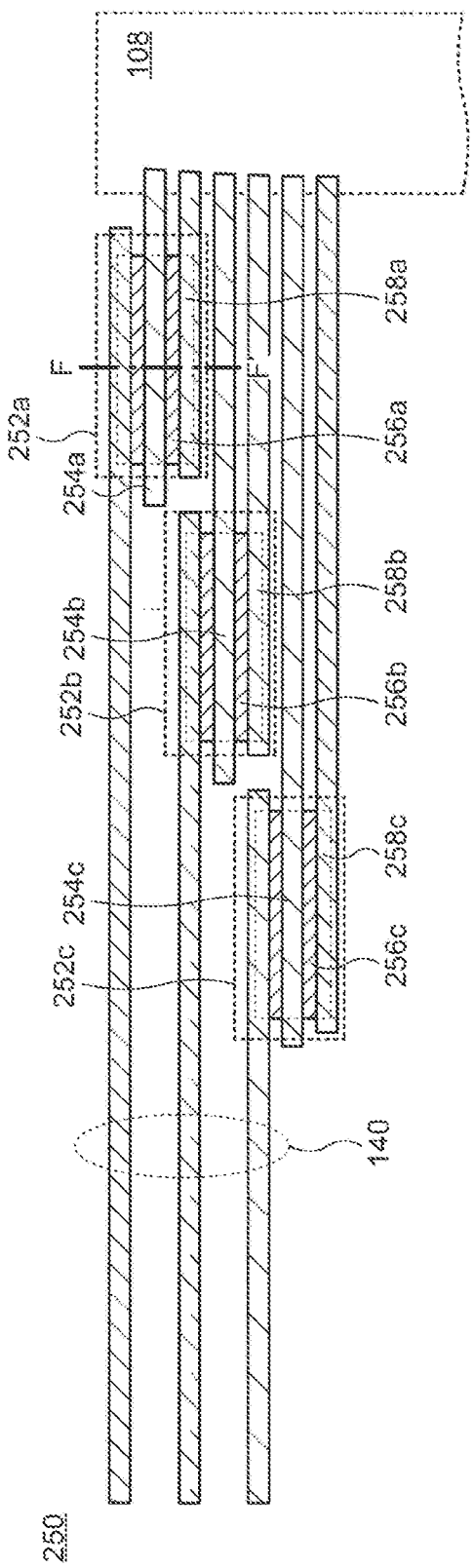
FIG. 28 is a schematic top view of a display device according to an embodiment of the present invention.

FIG. 28 shows the scanning-line driver circuit 108 as well as the first to third scanning lines 140 respectively connected to the pixels 104 in the first to third rows intersecting the cutoff 114. Similar to the First Embodiment, each scanning line 140 is structured by one or more of the wirings selected from the write-controlling scanning line 128, the initialization-controlling scanning line 130, the compensation-controlling scanning line 132, the emission-controlling scanning line 134, and the reset-controlling line 136.

Figure 29:
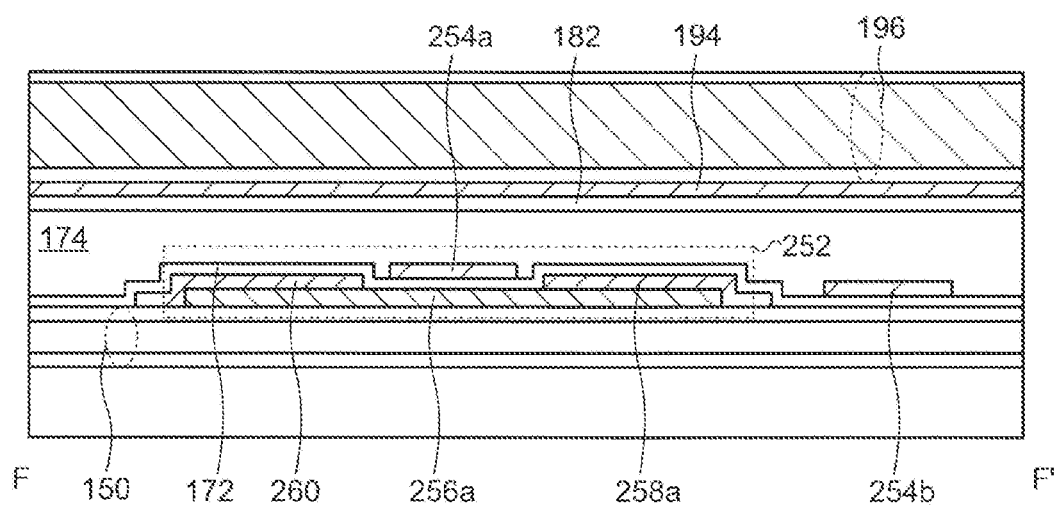
FIG. 29 is a schematic cross-sectional view of a display device according to an embodiment of the present invention.

As shown in FIG. 28, the compensating transistors 252 (252a to 252c) are fabricated at the respective terminal portions of the scanning lines 140. A schematic view of a cross section along a chain line F-F' in FIG. 28 is shown in FIG. 29. Each compensating transistor 252 possesses a semiconductor film 256 (a semiconductor film 256a in FIG. 28) in contact with the undercoat 150, a first terminal 260 and a second terminal 258 (second terminal 258a in FIG. 28) over the semiconductor film 256, the interlayer insulating film 172 covering the first terminal 260 and the second terminal 258, a gate electrode 254 (a gate electrode 254a in FIG. 28) located over the interlayer insulating film 172 and overlapping with the semiconductor film 256. The compensating transistor 252 is structured by the semiconductor film 256, the first terminal 260, the second terminal 258, the interlayer insulating film 172, and the gate electrode 254. Here, the first terminal 260 is a part of the scanning line 140. A signal supplied to each scanning line 140 is applied to the second terminal 258, and a potential is applied to the gate electrode 254 to turn on the compensating transistor 252, by which the signal is transmitted to the first terminal 260. In the example demonstrated in FIG. 29, the opposing electrode 194 is disposed so as to overlap with the compensating transistor 252. Note that not only the opposing electrode 194 but also the EL layer 192 may be provided so as to overlap with the compensating transistor 252. Alternatively, the EL layer 192 and the opposing electrode 194 may not overlap with the compensating electrode 252.

The semiconductor film 256 of the compensating transistor 252 exists in the same layer as the semiconductor films of the transistors in the pixel circuit. The first terminal 260 and the second terminal 258 exist in the same layer as the gate electrodes of the transistors in the pixel circuit. In addition, the gate electrode 254 exists in the same layer as the source/drain electrodes of the transistors in the pixel circuit. Hence, the display device 250 can be produced without placing any large stress on the manufacturing process.

A potential is applied to the gate electrode 254 from the scanning-line driver circuit 108, and mobility and a carrier concentration of the channel of the compensating transistor 252 are controlled by this potential. Namely, the compensating transistor 252 functions as a variable resistance because the resistance between the first terminal 260 and the second terminal 258 is controlled by the potential applied to the gate electrode 254. Independent control of the resistances of the compensating transistors 252 enables independent control of the resistance of each scanning line 140. Note that the potential applied to the gate electrode 254 may not be supplied from the scanning-line driver circuit 108 but may be supplied from the signal-line driver circuit 110 or an external circuit which is not illustrated. With this structure, a driving load can be independently provided to each of the scanning lines 140 connected to the pixels 104 arranged in the rows intersecting the cutoff 114. Accordingly, the load can be uniformly applied to the scanning lines 140 in the entire display region 106, allowing production of a display device in which generation of a display unevenness is suppressed.

Moreover, the compensating transistors 252 may be arranged so as not to overlap with each other in the column direction as shown in FIG. 28. In this case, each compensating transistor 252 may be arranged so that a direction in which the second terminal 258 of the jth compensating transistor 252 extends and a direction in which the (j+1)th scanning line 140 (or the first terminal of the (j+1)th compensating transistor 252) extends exist on the same straight line (j is a natural number smaller than k). This structure allows the compensating transistors 252 to be arranged without changing the interval between the scanning lines 140, thereby preventing an expansion of the frame region.

Figure 30:
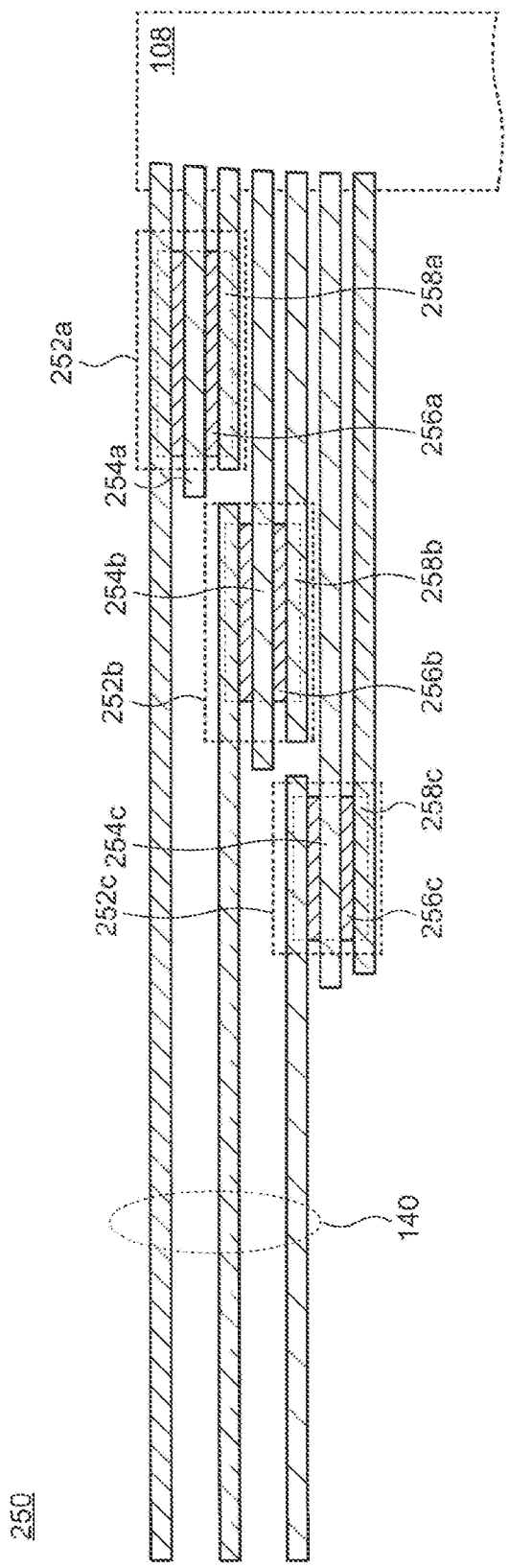
FIG. 30 is a schematic top view of a display device according to an embodiment of the present invention.

When the compensating transistors 252 are used, the channel widths and the channel lengths may be varied in every compensating transistor 252. For example, the compensating transistors 252 may be configured so that the channel width of the compensating transistor 252 of the first scanning line 140 is largest while the channel width of the compensating transistor 252 of the kth scanning line 140 is the smallest as shown in FIG. 30. That is, the compensating transistors 252 may be configured so that the channel width of the compensating transistor 252 of the (j+1)th scanning line 140 is larger than the channel width of the compensating transistor 252 of the jth scanning line 140. Although not illustrated, the compensating transistors 252 may be configured so that the channel width of the compensating transistor 252 of the (j+1)th scanning line 140 is smaller than the channel width of the compensating transistor 252 of the jth scanning line 140. The use of this structure enables the adjusting load to be varied between the first to kth scanning lines while fixing the potentials applied to the gate electrodes 254.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

It is properly understood that another effect different from that provided by the modes of the aforementioned embodiments is achieved by the present invention if the effect is obvious from the description in the specification or readily conceived by persons ordinarily skilled in the art.

What is claimed is:

1. A TFT array substrate comprising:
   a plurality of electrodes arranged in first to nth rows and first to mth columns;
   first to nth scanning lines arranged in the respective first to nth rows; and
   at least one first semiconductor film overlapping with at least one of the first to kth scanning lines selected from the first to nth scanning lines,
   wherein an active region defined by the plurality of electrodes has a cutoff intersecting the first to kth rows,
   the at least one first semiconductor film is located in the cutoff,
   each of the plurality of electrodes is electrically connected to a transistor having a second semiconductor film,
   the at least one first semiconductor film and the second semiconductor films exist in the same layer,
   the at least one first semiconductor film includes a first impurity,
   the second semiconductor film includes a second impurity different from the first impurity, and
   n and m are each a natural number larger than 1, and k is a natural number smaller than n.

2. The TFT array substrate according to claim 1, further comprising a plurality of current-supplying lines electrically connected to the plurality of electrodes,
   wherein the at least one first semiconductor film is electrically connected to at least one of the plurality of current-supplying lines.

3. The TFT array substrate according to claim 1, wherein the first to kth scanning lines are bent so as to detour around the cutoff.

4. The TFT array substrate according to claim 1, wherein the at least one first semiconductor film includes a plurality of first semiconductor films each overlapping with at least one of the first to kth scanning lines.

5. The TFT array substrate according to claim 4, wherein the plurality of first semiconductor films has a trapezoidal shape.

6. The TFT array substrate according to claim 1, further comprising a plurality of signal lines arranged in the respective first to mth columns,
   wherein the signal line in the column intersecting the cutoff is located between the adjacent first semiconductor films in a plan view.

7. The TFT array substrate according to claim 6, wherein the signal line in the column intersecting the cutoff has a width larger than that of the signal line in the column which does not intersect the cutoff.

* * * * *